(12) United States Patent
Saen et al.

(10) Patent No.: US 8,242,589 B2
(45) Date of Patent: Aug. 14, 2012

(54) SEMICONDUCTOR DEVICE

(75) Inventors: Makoto Saen, Kodaira (JP); Kenichi Osada, Tokyo (JP); Kiyoto Ito, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/148,993

(22) PCT Filed: Feb. 27, 2009

(86) PCT No.: PCT/JP2009/053742
§ 371 (c)(1),
(2), (4) Date: Aug. 11, 2011

(87) PCT Pub. No.: WO2010/097947
PCT Pub. Date: Sep. 2, 2010

(65) Prior Publication Data
US 2011/0309359 A1  Dec. 22, 2011

(51) Int. Cl.
H01L 23/02 (2006.01)
(52) U.S. Cl. ......................... 257/686; 257/777
(58) Field of Classification Search .................... 257/48, 257/685, 686, 698, 777, 723, 724
See application file for complete search history.

(56) References Cited

U.S. PATENT DOCUMENTS

| | | | |
|---|---|---|---|
| 4,228,324 A * | 10/1980 | Rasmussen et al. | 379/163 |
| 6,282,680 B1 * | 8/2001 | Takagi et al. | 714/724 |
| 6,788,070 B2 | 9/2004 | Ishigaki | |
| 7,028,235 B1 | 4/2006 | Kato | |
| 2003/0197515 A1 | 10/2003 | Ishigaki | |
| 2004/0262775 A1 * | 12/2004 | Ohie | 257/777 |
| 2005/0007143 A1 | 1/2005 | Ishigaki | |
| 2005/0270859 A1 | 12/2005 | Kato | |
| 2007/0007988 A1 * | 1/2007 | Hata | 324/765 |
| 2007/0132085 A1 | 6/2007 | Shibata et al. | |
| 2010/0078635 A1 * | 4/2010 | Kuroda et al. | 257/48 |

FOREIGN PATENT DOCUMENTS

| | | |
|---|---|---|
| CN | 101248363 A | 8/2008 |
| DE | 600 21 129 T2 | 5/2006 |
| EP | 1 026 696 A2 | 8/2000 |
| EP | 1 515 345 A1 | 3/2005 |
| JP | 62-188980 A | 8/1987 |
| JP | 2000-221226 A | 8/2000 |
| JP | 2003-309183 A | 10/2003 |
| JP | 2007-158237 A | 6/2007 |
| TW | 527491 | 4/2003 |
| WO | WO 2007/032184 A1 | 3/2007 |

* cited by examiner

Primary Examiner — S. V Clark
(74) Attorney, Agent, or Firm — Miles & Stockbridge P.C.

(57) ABSTRACT

In a test method of stacked LSIs connected by Through Silicon Vias, it is difficult to perform a failure diagnosis by using a conventional device test method to only one side of a silicon wafer, there is a possibility of yield degradation at a stacking time of LSIs, and a plurality of LSIs is connected to one Through Silicon Via so that it is necessary to select and remedy a defective Through Silicon Via taking into account all the device states. These problems cannot be solved by conventional test methods. Therefore, for a device test of a Through Silicon Via through a plurality of chips, a circuit that generates a time-series test pattern having both 0 and 1 values for a delay fault test is added to a circuit portion that transmits data to a Through Silicon Via in the stacked LSIs, and a circuit that receives the test pattern and compares the pattern received with a fixed pattern for a match to detect a defect of a Through Silicon Via is added to a circuit portion that receives data from a Through Silicon Via in the stacked LSIs.

18 Claims, 14 Drawing Sheets

FIG. 2

| Defective Through Silicon Via | TSEL_0 | TSEL_1 | TSEL_2 | TSEL_3 | TSEL_4 | TSEL_5 | TSEL_6 | TSEL_7 |
|---|---|---|---|---|---|---|---|---|
| TSVS_0 | TSVS_1 | TSVS_2 | TSVS_3 | TSVS_4 | TSVS_5 | TSVS_6 | TSVS_7 | TSVS_8 |
| TSVS_1 | TSVS_0 | TSVS_2 | TSVS_3 | TSVS_4 | TSVS_5 | TSVS_6 | TSVS_7 | TSVS_8 |
| TSVS_2 | TSVS_0 | TSVS_1 | TSVS_3 | TSVS_4 | TSVS_5 | TSVS_6 | TSVS_7 | TSVS_8 |
| TSVS_3 | TSVS_0 | TSVS_1 | TSVS_2 | TSVS_4 | TSVS_5 | TSVS_6 | TSVS_7 | TSVS_8 |
| TSVS_4 | TSVS_0 | TSVS_1 | TSVS_2 | TSVS_3 | TSVS_5 | TSVS_6 | TSVS_7 | TSVS_8 |
| TSVS_5 | TSVS_0 | TSVS_1 | TSVS_2 | TSVS_3 | TSVS_4 | TSVS_6 | TSVS_7 | TSVS_8 |
| TSVS_6 | TSVS_0 | TSVS_1 | TSVS_2 | TSVS_3 | TSVS_4 | TSVS_5 | TSVS_7 | TSVS_8 |
| TSVS_7 | TSVS_0 | TSVS_1 | TSVS_2 | TSVS_3 | TSVS_4 | TSVS_5 | TSVS_6 | TSVS_8 |
| TSVS_8 | TSVS_0 | TSVS_1 | TSVS_2 | TSVS_3 | TSVS_4 | TSVS_5 | TSVS_6 | TSVS_7 |

FIG. 5

Relationship between a test target Through Silicon Via and a test result transmission Through Silicon Via in the aspect in FIG. 3

| Test target Through Silicon Via | Test result transmission Through Silicon Via |
|---|---|
| TSVS_0 | TSVS_1 |
| TSVS_1 | TSVS_2 |
| TSVS_2 | TSVS_3 |
| TSVS_3 | TSVS_4 |
| TSVS_4 | TSVS_0 |

SEMICONDUCTOR DEVICE

TECHNICAL FIELD

The present invention relates to a semiconductor device, and in particular relates to a device test on an LSI group configured in a stacked package.

BACKGROUND ART

Along with development in microfabrication technology, an LSI has been improved in performance by integrating more transistors into a single chip. However, because of limitation of miniaturization or increase of utilization cost of a state-of-the-art process, it is not necessarily an optimum solution to develop such conventional integration into a single chip. Therefore, three-dimensional integration obtained by stacking a plurality of LSIs is a promising technique.

To obtain desired performance in stacked LSIs, a communication function between the stacked LSIs is important. A powerful solution for a communication system for stacked LSIs is multi-pin 3D communication utilizing Through Silicon Vias.

Here, when performing 3D communications utilizing Through Silicon Vias, it is assumed that more than several thousand Through Silicon Vias are formed, and toward mass production it is required to remedy a connection defect or the like of Through Silicon Vias so that yield is improved. Patent Document 1 has referred to having spare Through Silicon Vias for improving yield.

Patent Document 1: Japanese Patent Application Laid-Open Publication No. 2007-158237

DISCLOSURE OF THE INVENTION

Problems to be Solved by the Invention

However, in the Patent Document 1, though a test function of testing which Through Silicon Via is defective is essential in order to control the spare Through Silicon Vias, there is no mention of that.

Since the Through Silicon Via may cause such a defect as disconnection, short circuit, positional deviation, or variation in resistance value/capacitance value, it is necessary to detect these defects. However, a method of testing stacked LSIs connected by Through Silicon Vias, in particular, a method of testing a state of connections of Through Silicon Vias, includes a matter that is not assumed by a conventional testing method. That is, in a conventional device test method for only one surface of a silicon wafer, the test is performed such that electrodes exposed on a wafer surface are touched by a probe, but in stacked LSIs using Through Silicon Vias, of course, the test can be performed only after stacking. Then, electrodes of a lower LSI are hidden by an upper LSI, and accordingly cannot be tested by probe touch. Therefore, a new test method for Through Silicon Vias is required. Further, when a plurality of LSIs are stacked, the plurality of LSIs are connected to one Through Silicon Via, and it is necessary to select and remedy a defective Through Silicon Via, taking into account the states of all these devices.

Means for Solving the Problems

The typical ones of the inventions disclosed in the present application will be briefly described as follows. Note that, unless otherwise mentioned, these inventions solve their individual specific problems, and can be recognized to be independent inventions. Further, by combining these points of view, a method of testing/remedying a Through Silicon Via can obtain a synergistic effect.

(1) First, a feature is that identical test patterns are retained on stacked LSIs, respectively, and comparisons of the test patterns are performed within the respective LSIs to determine whether the LSIs are good or bad. This can realize performing a Through Silicon Via test inside, against the problem that each LSI cannot be tested separately because a Through Silicon Via of each LSI is not exposed after stacking, and besides, it becomes possible to perform remedy/selection based on the result. Further, this configuration is particularly preferred by a test of a Through Silicon Via that can be tested only after stacking, since the Through Silicon Via functions like a wiring, and only few test patterns retained by the respective LSIs are required.

(2) Second, the present invention is characterized in that the test result is transmitted to another Through Silicon Via other than the Through Silicon Via tested. This makes it possible to transmit the test result to another LSI without providing many special Through Silicon Vias, so that it is possible to test and remedy a Through Silicon Via without putting a tester probe on the Through Silicon Via.

(3) Third, the present invention is configured so as to transmit test patterns collectively to a plurality of LSIs. This makes it possible to perform the test at a higher speed than that of such a situation that tests are performed separately on a plurality of LSIs, though portions to be tested increase with increase in number of stacked LSIs. In particular in this case, since identical test patterns are retained by the respective LSIs for the above (1), it becomes possible to perform comparison operations in parallel, and further it becomes possible to perform a test at a still higher speed.

Fourth, such a configuration is adopted as to transmit the test results collectively to a plurality of LSIs. In this configuration, regarding a Through Silicon Via, for example, there is a case where three LSIs such as LSI_A, LSI_B, and LSI_C are stacked in sequence, and no bonding defect occurs in a Through Silicon Via between LSI_A and LSI_B, but a bonding defect occurs in a Through Silicon Via between LSI_B and LSI_C. The problem is solved that, in this case, since the Through Silicon Via is connected to all LSI_A to LSI_C, LSI_A with no bonding defect is also required to be remedied. This configuration makes it possible to know a defective Through Silicon Via in a plurality of LSIs by only one transmission, so that it becomes possible to change Through Silicon Vias even if LSI_A itself results in a good product. In this case, in particular, a combination with the configuration (2) makes collective transmission of the test results possible without preparing a special Through Silicon Via.

(5) Fifth, such a configuration is adopted as to provide a 2:1 selector circuit to sequentially shift Through Silicon Vias following a defective Through Silicon Via, thereby performing remedy. This configuration solves the problem that preparing one spare Through Silicon Via for one Through Silicon Via, as in the case of the Patent Document 1, increases the number of spare Through Silicon Vias, which results in large demerit regarding an area. Further, the configuration solves a problem of degradation in circuit symmetry caused by adopting such a configuration as to provide one spare Through Silicon Via for a plurality of Through Silicon Vias and replace a defective Through Silicon Via with the spare Through Silicon Via. This configuration improves the circuit symmetry, thereby reducing signal transmission delay or the like.

(6) Sixth, the present invention is characterized by a configuration to have a Through Silicon Via for test setting. This configuration solves the problem that test conditions cannot be set from a tester, unlike a conventional test method, since electrodes of each LSI are not exposed after stacking and a probe or the like cannot be used. This configuration makes it possible to put each LSI in a test operation even if it cannot be touched directly by a probe. Further, a portion of the Through Silicon Via for test adopts a flip-flop chain configuration. This makes various test operations possible with a small number of Through Silicon Vias.

(7) Seventh, the present invention is characterized by a configuration to contain a control unit that controls test of a Through Silicon Via in a lowermost LSI connected to a package substrate. This configuration solves the problem of how to control a test of a semiconductor device using a Through Silicon Via that has not been tested and therefore whose quality has not been guaranteed. Adopting this configuration makes it possible to perform a test of a Through Silicon Via using an LSI connected by a proven bonding method.

(8) Eighth, the present invention is characterized by preparing a test program in a nonvolatile memory provided outside a semiconductor device, executing the test program upon power-on, storing the result and remedy information in a memory unit composed of a volatile memory within each LSI, and then starting normal operation. Alternatively, the present invention is characterized by storing the remedy information in a nonvolatile memory provided outside, based upon a result of the test performed before shipment, and transferring the remedy information to each LSI upon power-on. These ways solve the problem that a conventional method of storing remedy information, such as a fuse, cannot be used, since a test of a Through Silicon Via cannot be performed until assembly has been completed. Though taking time on power-on, the former way can also remedy a defect due to aging. On the other hand, the latter way can save the test upon power-on, so that rapid start-up becomes possible. Further, both the cases can be realized without including nonvolatile memories in LSIs.

Effects of the Invention

The yield of stacked LSIs related to a failure of a Through Silicon Via can be improved, and besides, the reliability of stacked LSIs is improved by making tests of respective LSIs after stacking possible.

BRIEF DESCRIPTIONS OF THE DRAWINGS

FIG. 2 illustrates a system of remedying Through Silicon Via;

FIG. 5 illustrates a relationship between a Through Silicon Via to be tested and a Through Silicon Via for transmitting a test result;

DESCRIPTIONS OF REFERENCES

SLSI: LSI for stacking having a Through Silicon Via, TSVS (0 to 8): Through Silicon Via for signal transmission, TDRV: transmitting/receiving circuit of signals to a Through Silicon Via, TSVS_C: Through Silicon Via for notification of a signal receiving timing, CRTSV: Circuit for performing communication through a Through Silicon Via, FUNC: Functional circuit, TCRC: Circuit for a Through Silicon Via test, TCTRL: TCRC control circuit, TMEM: Memory unit that stores a Through Silicon Via test result, TSEL: Through Silicon Via selector, TSV_TCK: Clock for test control, TSV_TCM: Command signal for control of a signal for test control, TSV_TDI: Input signal of setting data for test control, TSV_TDO: Signal for test result output, SWHS and SWLS and SWH and SWL: Switch element, CLKG: Clock generation circuit, TDRVTSEL: Selector, TDRVTBUF: Test result receiving circuit, TPGEN: Test pattern generating circuit, TFSM: Control circuit for a whole TCTRL, TDRVRBUF: Test result transmitting circuit, SYSBD: Board mounted with stacked LSIs, NVMEM: Nonvolatile memory, VMEM: Volatile memory, STCLSIS: Stacked LSIs having a Through Silicon Via, TPPG: Program in which a Through Silicon Via test procedure is written, TMEMINF: information of selection of a Through Silicon Via to be used.

BEST MODE FOR CARRYING OUT THE INVENTION

[First Embodiment]

Figure 1:
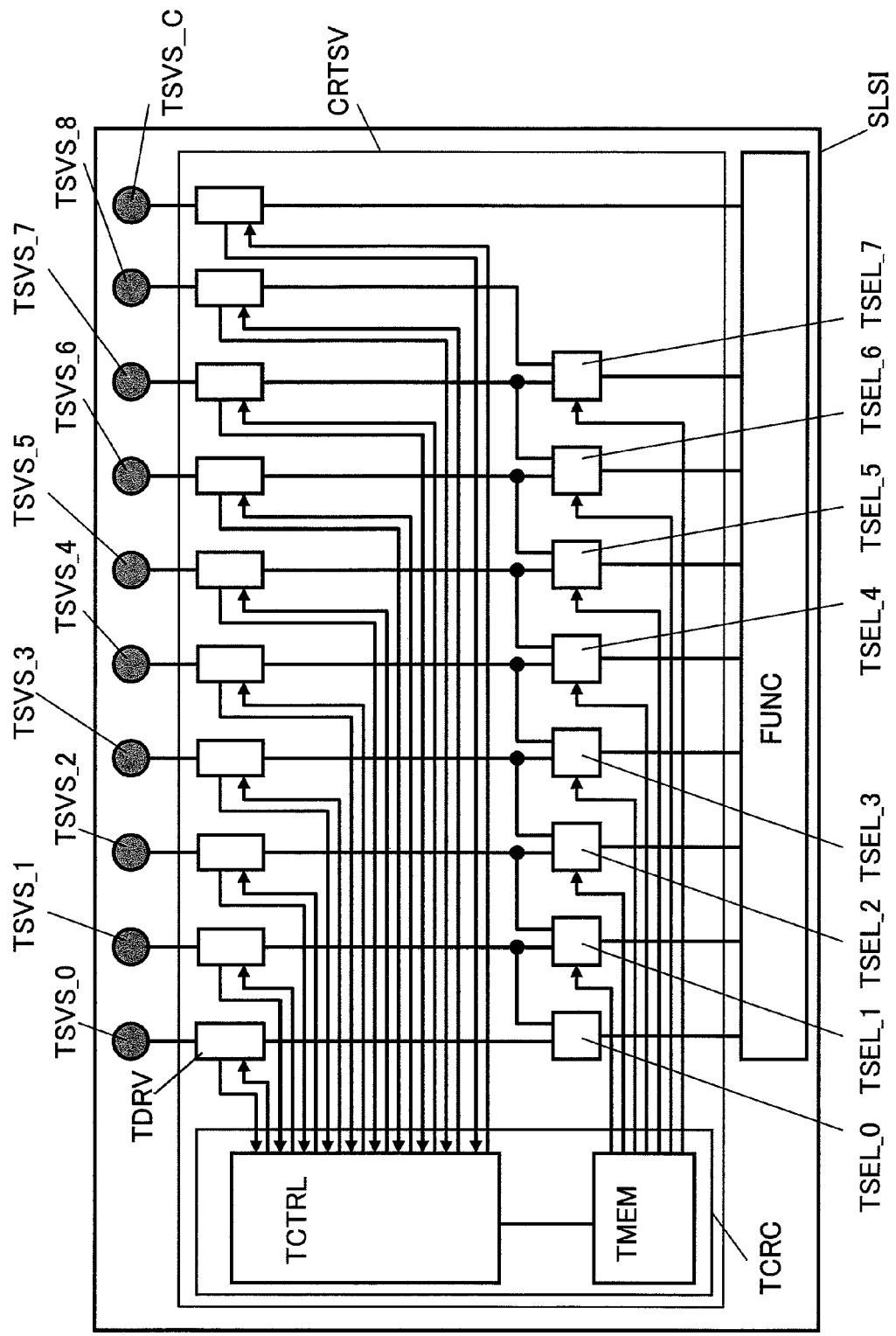
FIG. 1 illustrates a Through Silicon Via test and a configuration of a remedy circuit of stacked LSIs.

FIG. 1 illustrates an outline of an aspect of a Through Silicon Via device test and a defect remedy circuit in an LSI (SLSI) for stacking having Through Silicon Vias. The device test is simply referred to as test below. TSVS (0 to 8) is a Through Silicon Via for signal transmission, and TSVS_C is a Through Silicon Via for notification of a signal receiving timing. Therefore, a signal supplied to the Through Silicon Via TSVS (0 to 8) is outputted outside the LSI or taken into the LSI in synchronization with a timing signal (for example, a clock signal) transmitted through the TSVS_C. CRTSV is a communication circuit to perform communication through the Through Silicon Via, and includes a test circuit to perform the Through Silicon Via test. FUNC is a function block excluding the above-mentioned Through Silicon Via and CRTSV, and includes, for example, a processor, a clock control circuit, etc.

TCRC in CRTSV is a circuit for Through Silicon Via test, and has a test control unit TCTRL and a memory unit TMEM that stores a test result. In the present embodiment, one TCRC is disposed for every nine Through Silicon Vias, but any ratio is possible. TDRV connected to TSVS is a transmitting and receiving circuit that transmits a signal to a Through Silicon Via, or receives a signal from a Through Silicon Via, or performs both transmission and reception. Though the details of this transmitting and receiving circuit will be described later, only a transmitting circuit can be provided if only transmission is performed, or only a receiving circuit can be provided if only reception is performed. Though the operation of TDRV depends on whether it transmits or receives a signal, TDRV has an input from the test circuit TCRC and an output to TCRC. TSEL is a select circuit that connects either one of two signals connected to TDRV to the function block FUNC, one of the two signals to be selected is outputted from TMEM that is a memory unit in the Through Silicon Via test circuit TCRC. With respect to a number N of necessary signals of the functional circuit FUNC (input/output node number N), (N+1) Through Silicon Vias are prepared, and N Through Silicon Vias of them are selected by the TSEL circuit and connected to FUNC. Therefore, at most defective one can be accommodated with respect to (N+1) Through Silicon Vias. In the embodiment shown in FIG. 1, nine Through Silicon Vias including one redundant Through Silicon Via for eight necessary signals are connected to the functional circuit. TCRC tests the nine Through Silicon Vias, selects Through Silicon Vias that have no defect and are usable from the test result, and stores the result in TMEM, and based on the result, TSEL selects Through Silicon Vias so as not to connect a defective Through Silicon Via to FUNC.

FIG. 2 illustrates a relationship between the position of a defective Through Silicon Via and selection of Through Silicon Vias performed by TSEL. For example, the fourth row shows which TSVS each TSEL block connects to FUNC if TSVS2 is defective. That is, the defective TSVS2 itself is not replaced with a redundant Through Silicon Via additionally provided, but all Through Silicon Vias after TSVS2 are replaced with the next Through Silicon Vias. This makes it only necessary to connect each Through Silicon Via to the 2:1 select circuit TSEL, which results in an advantage in terms of signal transmission delay or layout arrangement. On the other hand, if the defective TSVS itself is intended to be replaced with the redundant Through Silicon Via, an 8:1 selector circuit is required for the redundant Through Silicon Via, and the other Through Silicon Vias and the circuit configuration vary, and therefore a difference in signal transmission delay, a difference in layout, or the like is caused. Further, it is preferable in view of a wiring length or the like that TSVS (0 to 8) are disposed physically adjacent to each other. In particular, for such a configuration to transmit or receive a signal in synchronization with timing of a clock signal as the present embodiment, it is not preferable that signal transmission delays differ from signal to signal, and therefore such a configuration as the present embodiment is desired.

Further, in the present invention, for the device test of the Through Silicon Via through a plurality of chips, a test pattern generation circuit that generates a test pattern for detecting a failure is added in a circuit that transmits data to the Through Silicon Via in the stacked LSIs, and a comparison circuit that receives the test pattern and performs comparison for a match between the received pattern and an expected pattern to detect a failure of the Through Silicon Via is added in a circuit section that receives data from the Through Silicon Via in the stacked LSIs.

Figure 3:
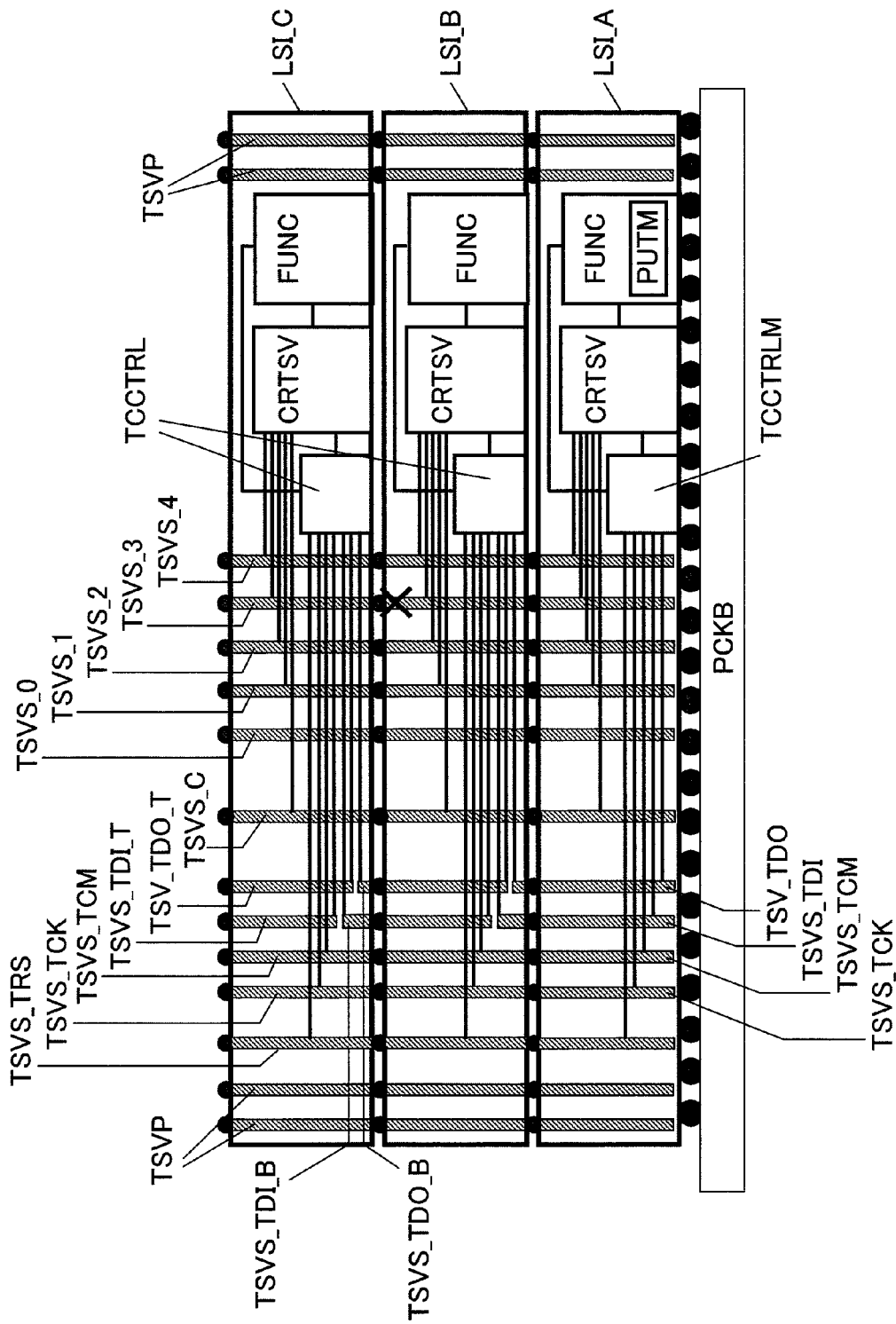
FIG. 3 illustrates a configuration of a Through Silicon Via test circuit in stacked LSIs.

FIG. 3 illustrates a cross section of a stacked LSI package in which three LSIs (LSI_A, LSI_B, LSI_C) have been stacked. As in the case of FIG. 1, TSVS_0, TSVS_1, TSVS_2, TSVS_3, and TSVS_4 are Through Silicon Vias for signal transmission to be tested, TSVS_C is a Through Silicon Via for notification of a signal receiving timing, and these signals are connected to CRTSV. All LSIs that perform transmission or reception to the Through Silicon Via are connected to CRTSV. TSVP is a Through Silicon Via for power supply or ground. Further, in FIG. 3, as test Through Silicon Vias for performing setting or control for test, TSVS_TCK, TSVS_TCM, TSVS_TDO (including TSVS_TDO_B and TSVS_TDO_T), TSVS_TDI (including TSVS_TDI_B and TSVS_TDI_T), and TSVS_TRS are added. TSVS_TDO and TSVS_TDI are Through Silicon Vias that transmit setting information on the test, and TSVS_TCM is a Through Silicon Via that designates an operational state of a flip-flop chain described later in the test. TSVS_TRS is a Through Silicon Via that transmits a reset signal. Signals transmitted through these Through Silicon Vias are outputted outside the LSIs or taken into the LSIs in synchronization with a timing signal (for example, a clock signal) transmitted through TSVS_TCK. TSVS_TDI and TSVS_TDO are different from the other Through Silicon Vias in that the Through Silicon Vias between LSI_A and LSI_B and the Through Silicon Vias between LSI_B and LSI_C are disconnected. Though described later, this is for reducing the number of Through Silicon Vias by adopting a configuration to transmit test setting information from LSI_A to LSI_B and LSI_C sequentially by a scan chain system.

Further, in FIG. 3, the lowermost LSI_A is provided with a test setting transmitting circuit TCCTRLM and a test control unit PUTM to control the test of each LSI. PUTM is realized by causing the processor contained in the function block FUNC of LSI_A to read a test program externally and execute the same. Further, LSI_B and LSI_C stacked on LSI_A are provided with test setting receiving circuits TCCTRL that receive the test setting information from TCCTRLM. These TCCTRLM and TCCTRL will be described later.

Figure 4:
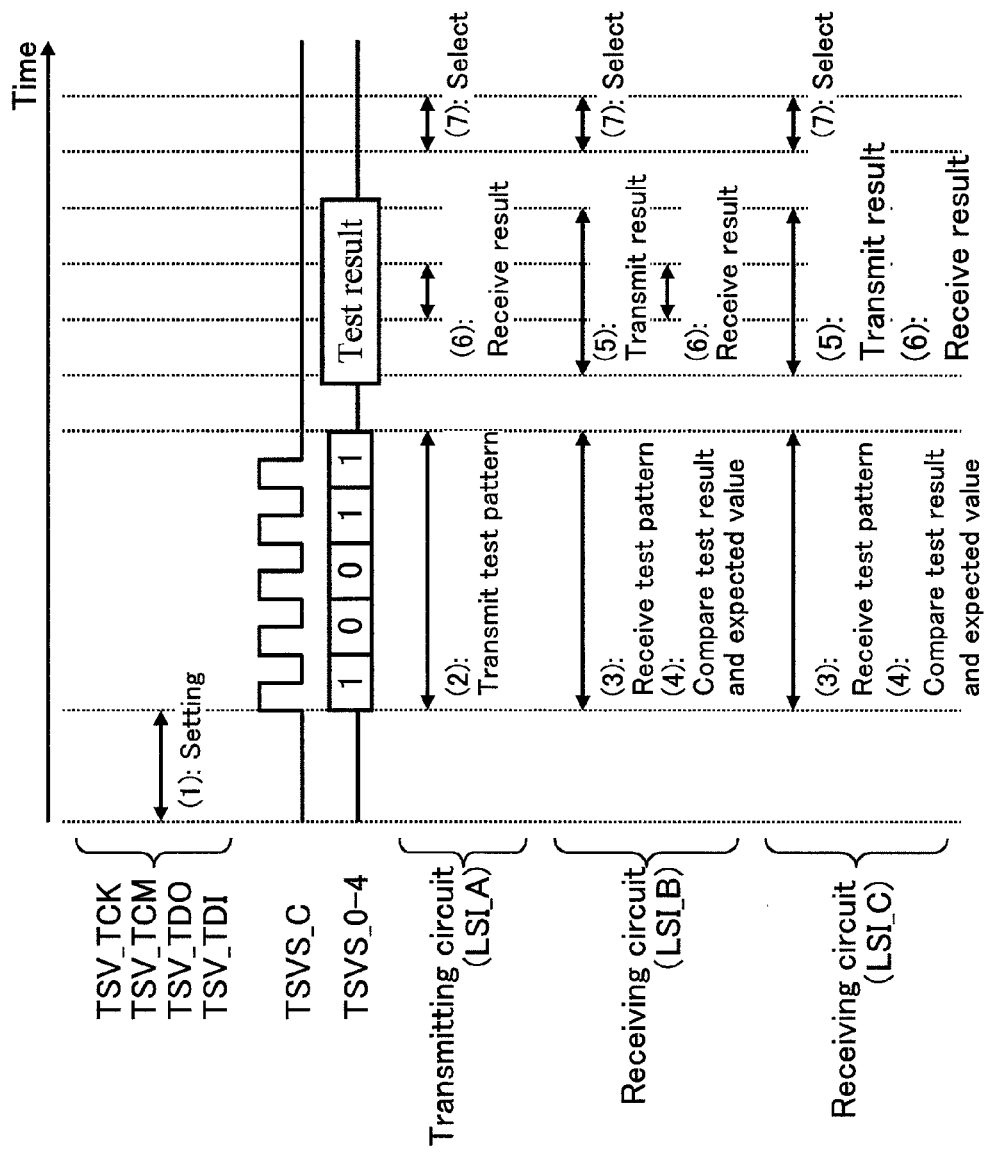
FIG. 4 illustrates a procedure of a Through Silicon Via test.

FIG. 4 illustrates one aspect of the Through Silicon Via test and remedy procedure in FIG. 3. Regarding this aspect, a case is described where a transmitting circuit is mounted on LSI_A and receiving circuits are mounted on the remaining LSI_B and LSI_C so that communication from LSI_A to LSI_B and communication from LSI_A to LSI_C are performed. Here, it is desired that the processor PUTM in LSI_A performs test control over the whole stacked LSIs. This is because the qualities of the Through Silicon Vias have not been confirmed at the stage of starting a test. In other words, since the lowermost LSI_A connected to a package substrate PCKB is used in this manner, test control without dependence on the qualities of the Through Silicon Vias is made possible by using an LSI connected by a proven connection method (connection through bonding wires or solder bumps). Note that the above-described TCCTRLM is provided in the lowermost layer from the same reason. Further, since the agent capable of controlling the test (PUTM) is owned by the stacked LSIs, the stacked LSIs can be tested alone in their stacked state in which a tester probe cannot touch the Through Silicon Vias, and therefore the test of the LSIs in a stacked and packaged state or the test thereof after being mounted on a system board becomes possible.

The procedure for test is composed of (1) performing Through Silicon Via test setting for each LSI, (2) transmitting a test pattern to a Through Silicon Via by a transmitting circuit of LSI_A, (3) receiving the test pattern from the Through Silicon Via by the receiving circuits of LSI_B and LSI_C, (4) comparing the test pattern received with an expected value by TCRC in the receiving circuits of LSI_B and LSI_C, (5) transmitting test results by the receiving circuits of LSI_B and LSI_C, (6) receiving the test results by LSI_A, LSI_B, and LSI_C, and (7) reflecting the test results in TMEM by LSI_A, LSI_B, and LSI_C.

First, at (1), CRTSV in each LSI is designated to perform a test as a transmitting circuit for the Through Silicon Via or to perform a test as a receiving circuit therefor. Note that a specific method of the setting will be described later. In the present embodiment, PUTM in LSI_A sets CRTSV of LSI_A to perform the test as a transmitting circuit, and sets CRTSV of LSI_B and LSI_C to perform the test as a receiving circuit. The designation to LSI_B and LSI_C from PUTM in LSI_A is performed through TCCTRLM, TCCTRL, and the Through Silicon Vias TSVS_TCK, TSVS_TCM, TSVS_TDO, and TSVS_TDI. TSV_TCK is a clock signal for test control, and transmitted through TSVS_TCK. TSV_TCM is a command signal for control of a signal for test control, and transmitted through TSVS_TCM. TSV_TDI is a signal for inputting data for test control into LSI_B and LSI_C, and transmitted through TSVS_TDI. TSV_TDO is a signal for reading information, such as the test result, from LSI_B and LSI_C to LSI_A, and transmitted through TSVS_TDO.

Next, at (2) and (3), CRTSV of LSI_A that performs the test as a transmitting circuit transmits a pattern for the Through Silicon Via test to the Through Silicon Via, and CRTSV of LSI_B and LSI_C that perform the test as receiving circuits receive the pattern. As the test pattern used here, one in which a change between 0 and 1 is generated is used so that a delay fault can be detected (at-speed test). That is, a pattern including all changes 0→1, 0→0, 1→1, and 1→0 is desired. Note that, in the present embodiment, 1→0→0→1→1 is used.

At (4), CRTSV of LSI_B and LSI_C compare a pattern received at (3) and an expected pattern value prepared in advance with each other, and if these patterns match each other, the communication through the Through Silicon Via is considered to be successful. Here, as the expected value, the same pattern as the transmitted pattern is previously retained by TCRC on the receiving side. In an operational test of a functional logic unit of a normal LSI, since it is necessary to conduct verifications corresponding to various logic patterns of the functional logic, it is difficult to prepare a configuration having a test pattern to be compared by another LSI in advance. However, the Through Silicon Via is a wiring, and it is only necessary to cause another LSI to retain only a test pattern identical with a test pattern transmitted. Further, in the present invention, since the test of an internal logic circuit and the test of the Through Silicon Via are performed separately, it is only necessary to cause another LSI to retain only the test pattern transmitted, and the data volume to be retained is small. Further, since the same expected value can be used in all the Through Silicon Vias, it is less disadvantageous to cause the LSI to retain the expected value therein. Here, the same pattern retained on the receiving side as that retained on the transmitting side does not mean completely the same pattern but means a pattern by which it is found that the test pattern transmitted from the transmitting side is correctly received on the receiving side. For example, the same pattern means a test pattern whose logic is inverted when a pattern whose logic has been inverted is received by a receiving buffer or the like and compared therewith.

At (5) and (6), CRTSV of LSI_B and LSI_C notify CRTSV of another LSI using the same Through Silicon Via of the test result clarified at (4), and CRTSV of LSI_A, LSI_B, and LSI_C receive the test result.

Transmission of the Through Silicon Via test result is performed through another Through Silicon Via other than the Through Silicon Via tested. This is because it is necessary to transmit a defect of a certain Through Silicon Via from a non-defective Through Silicon Via. Here, in this system, if defects have been found in Through Silicon Vias more than a remedial number (one for every N Through Silicon Vias), the notice that remedy is impossible is externally issued. Note that a method of external notification will be described later. FIG. 5 illustrates a relationship between Through Silicon Vias to be tested and Through Silicon Vias that transmit a test result in this aspect. For example, regarding TSVS_0, CRTSV of LSI_A transmits a test pattern, CRTSV of LSI_B and LSI_C receive the test pattern and compare the same with the expected value, and CRTSV of LSI_B and LSI_C output the test result to TSVS_1, and CRTSV of LSI_A, LSI_B, and LSI_C receive the test result regarding TSVS_0 from TSVS_1. Here, if there is a connection failure between LSI_B and LSI_C of TSVS_3, CRTSV of LSI_C notifies TSVS_3 with a connection failure of a data match in TSVS_2. However, this problem can be solved by causing CRTSV of all LSIs to precharge all Through Silicon Vias with a logic value representing a data match, before transmitting of the test result. That is, coincidence is obtained by default by a configuration to make a change from the precharged logic value only when a defect occurs, so that match information of TSVS_2 can be correctly transmitted. Note that, in the present embodiment, the number of Through Silicon Vias constituting one Through Silicon Via group is determined such that the possibility of occurrence of more than one defect in the one Through Silicon Via group is extremely reduced. Of course, when there is also a connection failure in TSVS_2, information cannot be correctly transmitted through TSVS_3, but, as described above, there is no problem because more than one defect is not remedied and is treated as a defective product. Note that a method of determining more than one defect will be described later.

At (7), a Through Silicon Via is selected such that a defective Through Silicon Via is not used based upon the test result received at (6), and the result is stored in TMEM in CRTSV. In the aspect in FIG. 3, one Through Silicon Via is used to perform communication from LSI_A to LSI_B and communication from LSI_A to LSI_C. Therefore, it is necessary to select a Through Silicon Via that can perform both the communications correctly, LSI_A, LSI_B, and LSI_C receive both the test results of the communication from LSI_A to LSI_B and the communication from LSI_A to LSI_C, and select a Through Silicon Via that succeeds in both the communications.

As described above, in the present embodiment, when a failure is found in a certain Through Silicon Via, the Through Silicon Via is considered to be defective, and TSEL are controlled so as not to use the Through Silicon Via in all stacked LSIs. For example, when a defect is found in the Through Silicon Via TSVS_3 by CRTSV of LSI_C in FIG. 3, TSEL of each LSI is controlled so as to prevent LSI_A and LSI_B from using TSVS_3, too. In order to achieve this, when a failure has been found in a certain Through Silicon Via by a certain receiving circuit, RCTSV of all LSIs using the Through Silicon Via are notified of the test result through another Through Silicon Via. Further, in the aspect in FIG. 4, both the communication from LSI_A to LSI_B and the communication from LSI_A to LSI_C are tested simultaneously so that simplification of the test procedure and time shortage are made possible.

Further, in the procedure illustrated in FIG. 4, since the test of the communication from LSI_A to LSI_B and the test of the communication from LSI_A to LSI_C are simultaneously performed, the test results are simultaneously transmitted from the plurality of LSIs of LSI_B and LSI_C, to one Through Silicon Via.

Figure 6B:
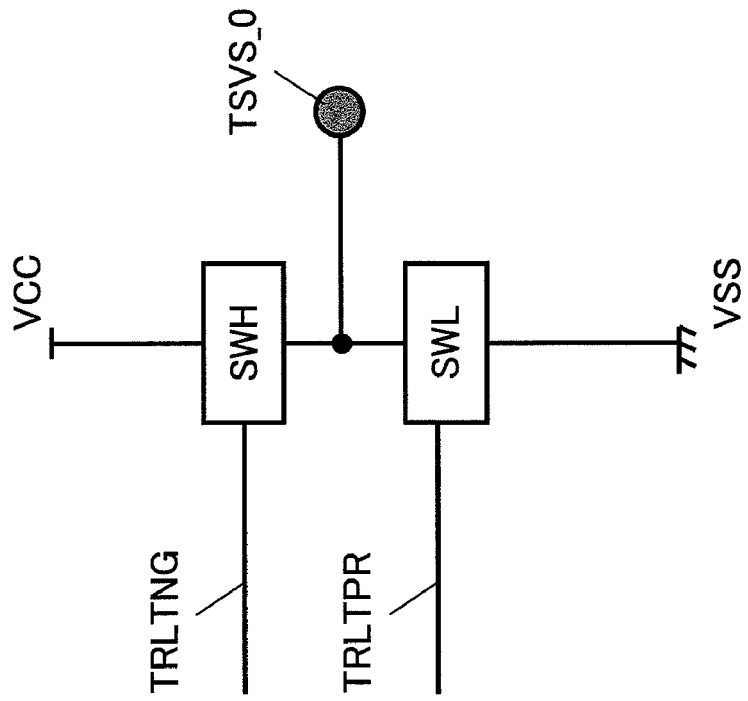
FIGS. 6A and 6B illustrate circuit configurations for transmitting a Through Silicon Via test result.
Figure 6A:
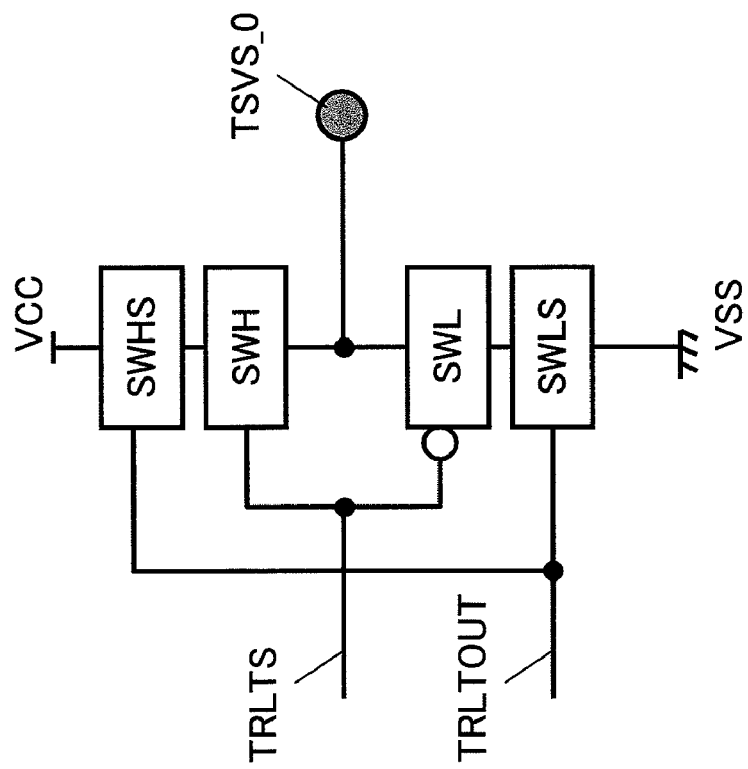

An aspect to achieve this is a-method that uses a transmitting circuit in which an output resistance when 1 is outputted as a test result to a Through Silicon Via and an output resistance when 0 is outputted are different. FIG. 6A illustrates an aspect of a transmitting circuit to a Through Silicon Via included in TDRV. In this figure, TSVS_0 is a Through Silicon Via that outputs a test result, SWHS and SWLS are switch elements for putting TSVS_0 into a floating state for a period when the test result is not outputted, TRLTOUT is a signal to control on/off of the switches of SWHS and SWLS, SWH is a switch that is turned on when 1 (VCC: operating voltage) is transmitted as the test result to TSVS_0, SWL is a switch that is turned on when 0 (VSS: ground voltage (<VCC)) is transmitted as the test result to TSVS_0, and TRLTS is a signal for controlling on/off of SWH and SWL. Here, the resistance when SWL is on is set sufficiently higher than that when the SWH is on. In other words, the drive force of SWH is set higher than the drive force of SWL. More specifically, a maximum number X of stacked LSIs is assumed, and the drive force of SWH is set higher than (X−1) times the drive force of SWL. When the test result is transmitted, SWL is first turned on to output 0 (VSS), and if the test result is successful, it keeps outputting 0, or if unsuccessful, switching is performed to output 1 (VCC). Therefore, if any of receiving circuits connected to the same Through Silicon Via issues a notice of failure, SWH with high drive force turns the Through Silicon Via into 1 (VCC) even if the other SWL is outputting 0 (VSS), so that all LSIs connected to the Through Silicon Via can recognize that the any is defective. Further, since a plurality of receiving circuits can transmit test results simultaneously, test control can be simplified.

Another embodiment can be a method that precharges a Through Silicon Via before transmitting a test result and discharges a value only when a defect has been found in the Through Silicon Via. For example, before the test result is transmitted, the Through Silicon Via is precharged with a value of 0 representing a success in test, and the receiving circuit does not output a value if transmitting of the test result is successful, or outputs a value of 1 only if unsuccessful. FIG. 6B illustrates an aspect of this transmitting circuit to a Through Silicon Via. In this figure, TSVS_0 is a Through Silicon Via that outputs a test result, SWL is a switch element for precharging the Through Silicon Via with 0 (VSS), TRLTPR is a signal for controlling SWL, SWH is a switch element for outputting 1 (VCC) if the test result is unsuccessful, and TRLTNG is a signal for controlling SWH. Here, the operation of the circuit in FIG. 6B will be described. First, SWL is turned on immediately before (5) transmitting a result in FIG. 4, and the Through Silicon Via is precharged with 0 (VSS). Thereafter, SWL is turned off so that the Through Silicon Via is put into a floating state, and then SWH is turned on, and the result is transmitted (the timing at (5) in FIG. 4). Also in this aspect, if any of receiving circuits connected to the same Through Silicon Via issues a notice of failure, all LSIs connected to the Through Silicon Via can recognize that the receiving circuit is defective, and further, since a plurality of receiving circuits can transmit test results simultaneously, test control can be simplified. Further, as compared with the system in FIG. 6A, since this system is configured such that the transmitting circuit does not issue output when the test result is a match, but the transmitting circuit issues output only when a mismatch, it is possible to design a circuit without taking into account the maximum number of stacked LSIs. Note that, though defined in the description of FIGS. 6A and 6B, the respective logic values of success and failure are defined, but these are not restrictive, and can be reversed, of course.

Figure 7:
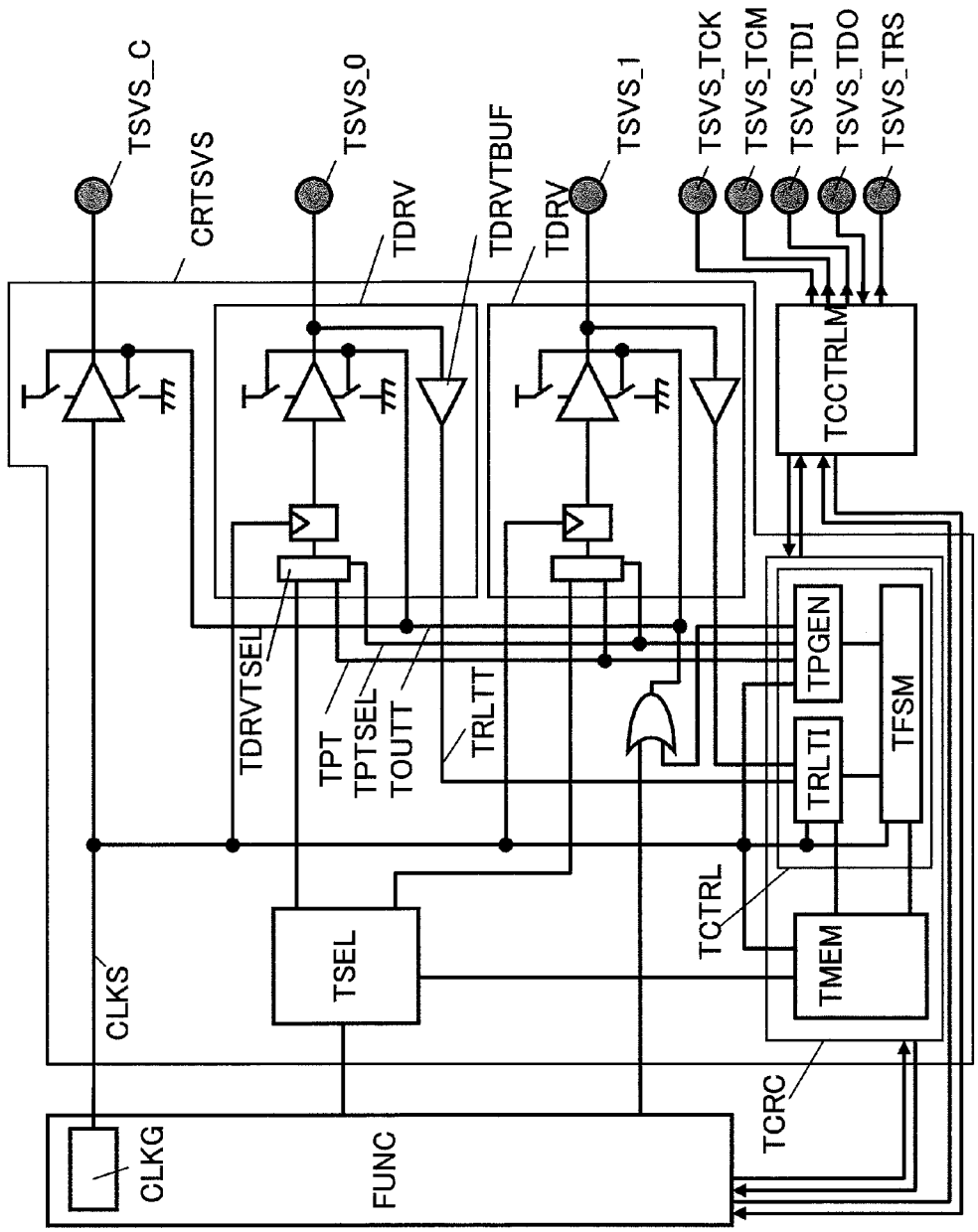
FIG. 7 illustrates a configuration of a Through Silicon Via signal transmitting circuit.
Figure 8:
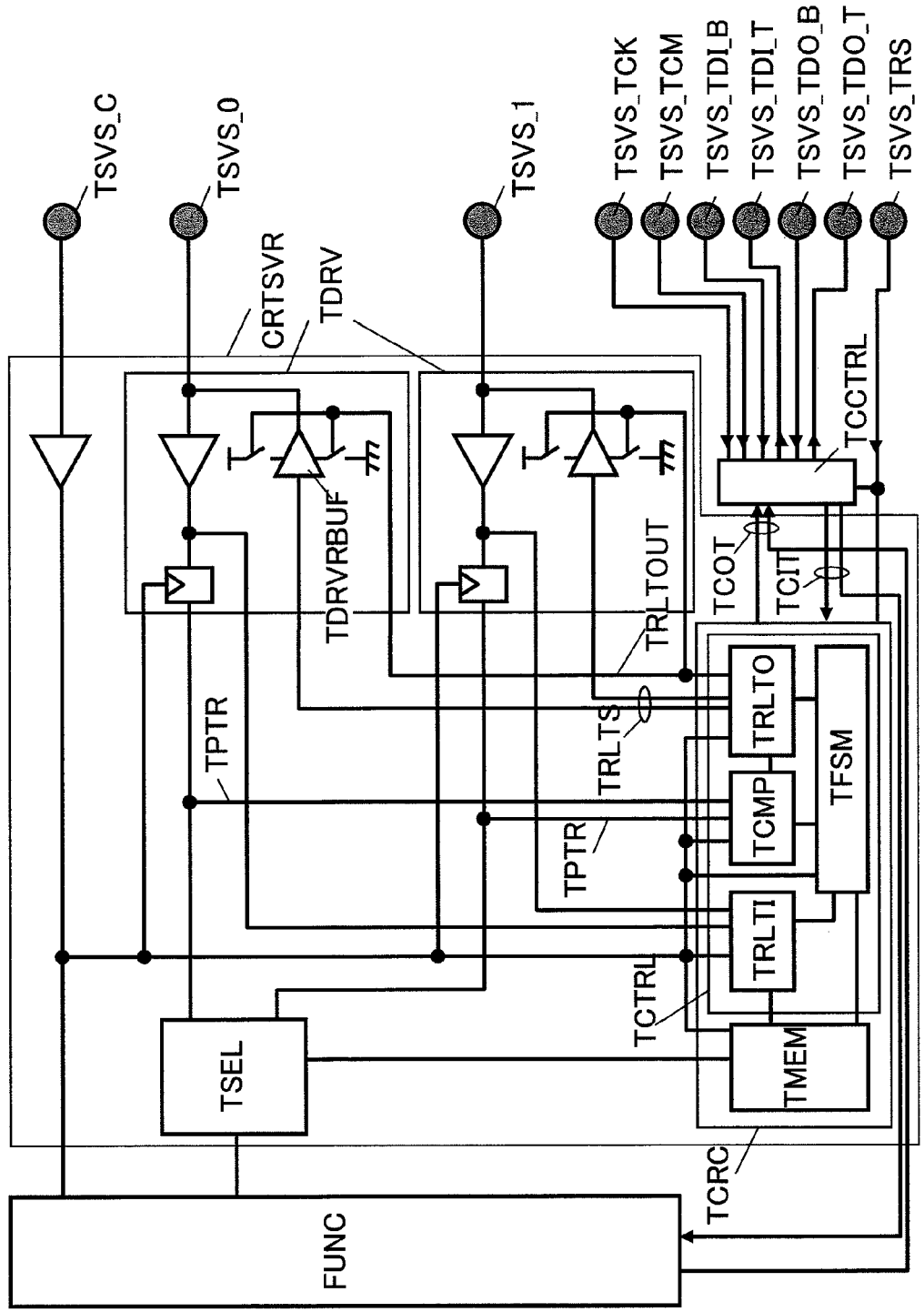
FIG. 8 illustrates a configuration of a Through Silicon Via signal receiving circuit.

Next, a configuration of the Through Silicon Via test circuit CRTSV is shown in FIGS. 7 and 8. FIG. 7 illustrates a transmitting circuit for transmitting data to a Through Silicon Via (however, for convenience of description, descriptions will be made on the assumption that the number of Through Silicon Vias for signal transmission is two), and FIG. 8 illustrates a circuit for receiving data from the transmitting circuit of FIG. 7 (similarly, the number of Through Silicon Vias for signal transmission differs). Note that, in the present embodiment, LSI_A is used as the transmitting circuit, and accordingly, for convenience of description, the test setting transmitting circuit TCCTRLM provided to the lowermost LSI is also illustrated in FIG. 7. Likewise, LSI_B and LSI_C are used as the receiving circuits, and accordingly, for convenience of description, the test setting receiving circuit TCCTRL is also shown.

Here, in each LSI, for one Through Silicon Via, both the transmitting circuit and the receiving circuit may be provided, or either the transmitting circuit or the receiving circuit may be provided. The former is effective, for example, for a case where the Through Silicon Via is used as a bidirectional bus, or a case where the Through Silicon Via is set regarding whether it is used as an electrode for transmitting or an electrode for receiving for each LSI after being stacked. The latter is effective, for example, for a case where it is clear that a processor LSI uses the Through Silicon Via as an electrode for transmitting and a memory LSI uses the Through Silicon Via as an electrode for receiving, such as Through Silicon Vias for address signal transmission in a case where the processor LSI and the memory LSI have been stacked.

The transmitting circuit described in FIG. 7 outputs TSVS_C, TSVS_0, and TSVS_1, and the receiving side described in FIG. 8 receives data of TSVS_0 and TSVS_1 with the timing of TSVS_C.

In FIG. 7, TDRV is a circuit of transmitting Through Silicon Via signal, CRTSV is a circuit for performing transmission through a Through Silicon Via, and CLKG is a clock generation circuit. TDRV serves to perform data transmission during normal communication, to perform transmission of a test pattern during Through Silicon Via test, and to perform reception of a test result from the Through Silicon Via. TDRVTSEL is a select circuit for selecting and outputting either transmission data from TSEL during normal communication or a test pattern from TCRC during the Through Silicon Via test. TDRVTBUF is a receiving circuit for receiving a Through Silicon Via test result, and outputs the received result to TCTRL through a TRLTT signal. Note that, in a case of an LSI having both the transmitting circuit and the receiving circuit, TDRVTBUF may be shared by a receiving buffer in FIG. 8. TPGEN in TCTRL is a test pattern generation circuit, TRLTI is a memory storage circuit that selects a Through Silicon Via to be used based upon the test result and stores the selection result in TMEM, and TFSM is a control circuit for the whole TCTRL. TCCTRLM is a test setting transmitting circuit for performing setting for the Through Silicon Via test through dedicated Through Silicon Vias (TSVS_TCK, TSVS_TCM, TSVS_TDO_B, TSVS_TDO_T, TSVS_TDI_B, TSVS_TDI_T, and TSVS_TRS).

In FIG. 8, TDRV is a Through Silicon Via signal receiving circuit, and CRTSVR is a receiving circuit for performing reception through a Through Silicon Via. TDRV serves to perform data reception during normal communication, to perform reception of a test pattern during a Through Silicon Via test, and to perform transmission and reception of a test result to the Through Silicon Via. In addition to the receiving circuit, a transmitting circuit TDRVRBUF for transmitting a test result from TCRC is included. TDRVRBUF has a switch for disconnection for a period other than when a test result is transmitted, and this switch is controlled by TCRC through a TRLTOUT signal. TCMP in TCRC is a comparison circuit that compares a test pattern received and an expected test pattern with each other, TRLTO is an output control circuit that takes control when the test result is transmitted, TRLTI is a memory storage circuit that selects a Through Silicon Via to be used based upon the test result and stores the selection result in TMEM, and TFSM is a control circuit for the whole TCTRL. TCCTRL is a test setting circuit for performing setting for a Through Silicon Via test.

In normal communication that is not a test, data outputted from FUNC on the transmitting side in FIG. 7 is outputted to a Through Silicon Via (TSVS_0 or TSVS_1) connected by TSEL in synchronization with a clock signal of TSVS_C. The receiving side in FIG. 8 takes data of TSVS_0 and TSVS_1 in synchronization with a clock of TSVS_C, the received data of the Through Silicon Via selected by TSEL is inputted into FUNC, and then the communication is terminated.

Next, the operations of the circuits during the Through Silicon Via test will be described. The start of the test operation is set by TCCTRLM. First, TPGEN in TCRC within the transmitting circuit in FIG. 7 outputs a test pattern to TDRV through a TPT signal. At this test pattern outputting time, TDRVTSEL is controlled through a TPTSEL signal so as to output the test pattern, and a signal representing signal reception timing and the test pattern are controlled by a TOUTT signal so as to be outputted to TSVS_C and TSVS_0/1, respectively.

This signal representing a signal reception timing and the test pattern are inputted to the receiving circuit in FIG. 8 through TSVS_C and TSVS_0/1, and TDRV receives the test pattern in synchronization with the signal reception timing. The test pattern received is outputted to TCRC through a TPTR signal, and compared for a match with the expected pattern at TCMP in TCRC. If the test pattern received matches the expected pattern, it is considered that the Through Silicon Via has no failure.

Next, TRLTO in TCRC in FIG. 8 outputs the test result determined at TCMP in TCRC to TSVS_0/1 through a TRLTS signal. At this time, TDRVRBUF is put in a conduction state with the Through Silicon Via by the TRLTOUT signal. The important point here is that the reception result is transmitted to a Through Silicon Via other than the Through Silicon Via that received the reception result. In the present embodiment, the reception result of TSVS_0 (whether or not TSVS_0 has a failure) is outputted to TSVS_1, and the reception result of TSVS_1 is outputted to TSVS_0. This is because a result of failure is transmitted through a Through Silicon Via having no failure, as described above.

The test circuits TCRC in all transmitting circuits and receiving circuits designated as a test target by TCCTRLM and TCCTRL receive the reception result. Each TCRC recognizes a Through Silicon Via having a failure based upon the result, and stores information for TSEL control in TMEM so as not to use the defective Through Silicon Via.

Figure 9:
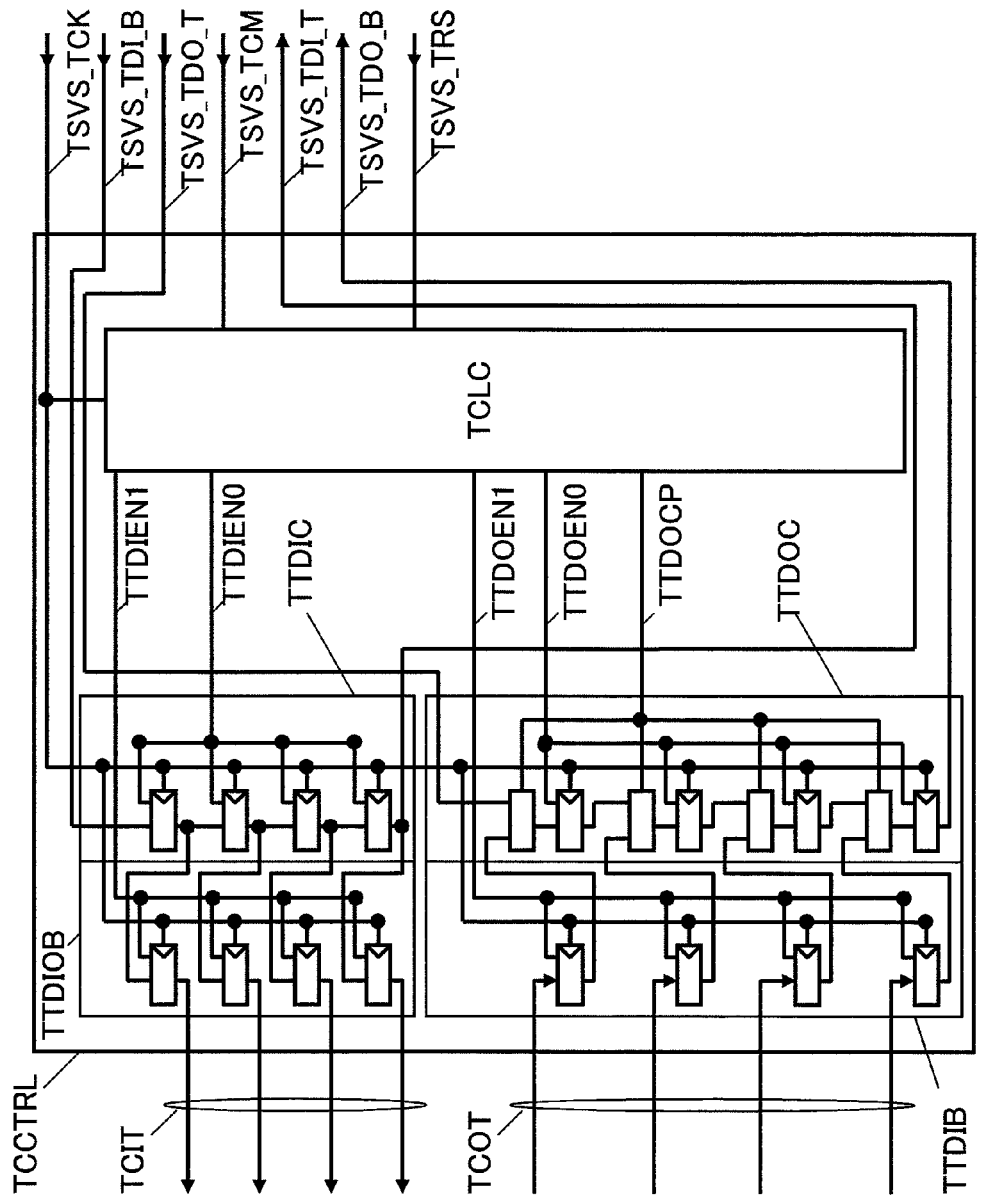
FIG. 9 illustrates a configuration of a test control circuit.

FIG. 9 illustrates the configuration of TCCTRL in FIG. 8. TCCTRL is a circuit for setting LSIs to be stacked for test. The operation of TCCTRL will be described here based upon the aspect in FIG. 3. At this time, TCCTRL are mounted on LSI_B and LSI_C to be stacked. These TCCTRL are controlled by TCCTRLM of LSI_A through dedicated Through Silicon Vias (TSVS_TCK, TSVS_TCM, TSVS_TDO_B, TSVS_TDO_T, TSVS_TDI_B, TSVS_TDI_T, and TSVS_TRS). TSVS_TCK is a clock signal for performing this setting, TSVS_TCM is a command signal for controlling this setting operation, TSVS_TDI_B and TSVS_TDI_T are signals for supplying setting information from LSI_A, and TSVS_TDO_B and TSVS_TDO_T are signals for LSI_A to acquire such information as the test results from LSI_B and LSI_C.

Among these Through Silicon Vias, TSVS_TCK, TSVS_TCM, TSVS_TRS, TSVS_TDI_B, and TSVS_T-DO_T of these Through Silicon Vias are input signals for TCCTRL, TSVS_TCK, TSVS_TCM, and TSVS_TRS are outputted by an LSI that controls the test on the whole stacked LSIs (outputted by LSI_A in the example in FIG. 3), TSVS_TDI_B is outputted by an LSI connected to an underlayer (outputted to LSI_B by LSI_A, outputted to LSI_C by LSI_B, in the example in FIG. 3), and TSVS_TDO_T is outputted by an LSI connected to an upper layer (outputted to LSI_B by LSI_C, outputted to LSI_A by LSI_B, in the example in FIG. 3). The remaining Through Silicon Vias, TSVS_TDI_T and TSVS_TDO_B, are output signals for TCCTRL, TSVS_TDI_T is an output to an LSI connected to an upper layer (outputted to LSI_B by LSI_C, and outputted to LSI_A by LSI_B in the example in FIG. 3), and TSVS_T-DO_B is an output to an LSI connected to an underlayer (outputted to LSI_B by LSI_A, and outputted to LSI_C by LSI_B in the example in FIG. 3). TSVS_TDI_B to TSVS_T-DI_T are connected by flip-flops connected in a chain at TTDIC in TCCTRL, TSVS_TDO_T to TSVS_TDO_B are connected by flip-flops connected in a chain at TTDOC in TCCTRL. This structure can form a route to transmit the setting information for the test from LSI_A to LSI_B and LSI_C, since flip-flops connected in a chain connect TSVS_TDI of LSI_A to TSVS_TDI_T of LSI_C. Further, in the same manner, by flip-flops connected in a chain connect from TSVS_TDO_T of LSI_C to TSVS_TDO of LSI_A, a route for LSI_A to acquire information such as the test result from LSI_B and LSI_C is formed.

The operational state of the flip-flop chain is put in a reset state by a reset signal transmitted through TSVS_RST, and every time TSVS_TCM transitions, change to (1) a shift operation state, to (2) a setting determination state, to (3) a result acquiring state, and to (4) a shift operation state occurs. Note that the flip-flop chain is returned to the reset state by the reset signal from any operational state. By limiting the operational state of the flip-flop chain to minimum necessary functions in this manner, TSVS_TCM can be realized with one chain. Note that more operational states, branching of a state, or the like can be realized by increasing the number of TSVS_TCM, or the like.

Next, the circuit operation of TCCTRL when LSI_A performs setting for test to LSI_B and LSI_C will be described (corresponding to (1) in FIG. 4). First, LSI_A outputs a clock signal through TSVS_TCK, and outputs a reset signal to TSVS_TRS. This causes the flip-flops for test included in LSI_B and LSI_C to be set at the reset state. Next, by causing the state of TSVS_TCM to transition, TCCTRL of LSI_B and LSI_C are put into an input transfer state (shift operation state). In this state, information inputted from TSVS_TDI_B of TCCTRL is shift-transferred toward TSVS_TDI_T in the flip-flop chain of TTDIC in synchronization with the rising of the clock of TSVS_TCK. By repeating this shift input operation as many times as needed, the setting information indicating operating as a receiving circuit can be inputted into TTDIC of LSI_B and LSI_C from LSI_A.

After this input by the shift operation is completed, LSI_A uses TSVS_TCM to cause a state transition such that TCCTRL of LSI_B and LSI_C are put into the setting determination states. The value of the flip-flop in TTDIC at the time point of being put into this state is retained in TTDIOB. TCRC and FUNC are notified of this information as setting information for test, LSI_B and LSI_C are set as receiving circuits, and thereafter the test operation in FIG. 4 is performed. By performing the above-described procedure from input transfer to setting determination, a large amount of test setting information is transferred by using the flip-flop chain, and therefore it becomes possible to perform setting for test through a small number of Through Silicon Vias. Further, by changing setting information transmitted in the flip-flop chain, various settings become possible. Therefore, it is possible to perform a test of an internal circuit even after stacking by providing inside a BIST circuit which performs not only the device test of the Through Silicon Via but also a test of a defect of the internal circuit at a stacking time in advance and setting test setting information indicating execution of the BIST circuit.

In contrast, it is also possible to use a flip-flop chain from TSVS_TDO_T of LSI_C to TSVS_TDO of LSI_A to cause LSI_A to acquire information, such as the test results, from LSI_B and LSI_C. This is applicable to a case where more than one defect has been occurred in the Through Silicon Via. First, after the above-described Through Silicon Via device test is terminated, LSI_A uses TSVS_TCK and TSVS_TCM to cause the state of TCCTRL to transition to the result acquiring state. In this state, information retained by TCRC and FUNC, such as the test results, is transferred to the flip-flop chain of TTDOC through TCOT and TTDIB. By performing this operation in a connected state of information, such as the test result, with TCOT, the test result information in LSI_B and LSI_C can be acquired in TTDOC.

Next, LSI_A uses TSVS_TCK and TSVS_TCM to put TCCTRL of LSI_B and LSI_C into a state of transferring a result. In this state, the information in the flip-flop chain of TTDOC is shift-transferred from TSVS_TDO_T toward TSVS_TDO_B in synchronization with the rising of the clock of TSVS_TCK. By repeating this shift operation as many times as needed, LSI_A can acquire information, such as the test results from TTDOC of LSI_B and LSI_C.

Note that, even if more than one defective Through Silicon Via is found, according to the remedy method of the present embodiment, first, only one of the defective Through Silicon Vias is remedied. Accordingly, an error occurs in the next operation test or the like. At this time, by extracting the test result retained inside according to the above-described method, even if more than one defect is found, the cause of the error can be identified, so that the LSI package can be sorted as a defective product.

As described above, by using the chain structure, setting for the Through Silicon Via test and acquisition of the test result can be achieved by a very small number of Through Silicon Vias. If a system that uses a large number of Through Silicon Vias to perform the setting is adopted, stacked LSIs that cannot be used due to a failure of a Through Silicon Via for setting increase. Therefore, the system that uses this shift chain has an effect of improving the whole yield. Additionally, though the Through Silicon Vias for test having the same diameter as the Through Silicon Vias for signal have are described in FIG. 3, it is preferable that the diameters of the Through Silicon Vias for test be set larger. In other words, it is preferable that a cross-sectional area parallel to an LSI surface of the Through Silicon Via for test be set larger than a cross-sectional area parallel to an LSI surface of the Through Silicon Via for signal. This reduces the rate of occurrence of defective Through Silicon Vias for test that cannot be remedied, and improves the yield further.

Moreover, in the present invention, the test pattern is transmitted from the transmitting circuit to each Through Silicon Via, and the received pattern is compared for a match with the expected value in the receiving circuit. As means to give these test patterns, though there is a method that gives a fixed test pattern as circuit information, there is also a method that sets the test patterns at the test time through the above-described TCCTRL circuit. The latter case has the advantage that the test patterns can be changed according to a test target. For example, it becomes possible to use different patterns for a Through Silicon Via for which a delay fault does not need to be detected and for a Through Silicon Via for which it does.

Primary inventions described in the first embodiment will be summarized as follows. Unless otherwise mentioned, the following points of view solve their individual specific problems, and can be recognized to be independent inventions. Further, by combining these points of view, a synergistic effect can be obtained as a method of testing/remedying a Through Silicon Via. Of course, in addition to the following primary inventions, there are inventions depending therefrom or independent thereof.

(1) First, the present invention is characterized in that identical test patterns are retained on stacked LSIs, respectively, and comparisons of the test patterns are performed within the respective LSIs to determine whether the LSIs are good or bad. This can realize performing a Through Silicon Via test inside, against the problem that respective LSIs cannot be tested alone because an electrode of each LSI is not exposed after stacking, and besides, it becomes possible to perform remedy/selection based on the result. Further, this configuration is particularly preferred by a test of a Through Silicon Via that can be tested only after stacking, since the Through Silicon Via functions like a wiring, and only few test patterns retained by the respective LSIs are required.

(2) Second, the present invention is characterized in that the test result is transmitted to another Through Silicon Via other than the Through Silicon Via tested. This makes it possible to transmit the test result to another LSI without providing a special Through Silicon Via, so that it is possible to test and remedy a Through Silicon Via without putting a tester probe on the Through Silicon Via.

(3) Third, the present invention is configured so as to transmit test patterns collectively to a plurality of LSIs. This makes it possible to perform the test at higher speed than that of such a case that tests are performed separately on a plurality of LSIs, though portions to be tested increase as the number of stacked LSIs increases. In particular in this case, since identical test patterns are retained by the respective LSIs for the above-described (1), it becomes possible to perform comparison operations in parallel, and further it becomes possible to perform a test at still higher speed.

Fourth, such a configuration is adopted as to transmit the test results collectively to a plurality of LSIs. Regarding a Through Silicon Via, for example, there is a case where three LSIs such as LSI_A, LSI_B, and LSI_C are stacked, and no connection defect occurs in a Through Silicon Via between LSI_A and LSI_B, but a connection defect occurs in a Through Silicon Via between LSI_B and LSI_C. In this case, since the Through Silicon Via is connected to all LSI_A to LSI_C, LSI_A with no connection defect is also required to be remedied. This configuration solves the above-mentioned problem and makes it possible to know which Through Silicon Via is defective in a plurality of LSIs by one transmission, so that it becomes possible to change Through Silicon Vias even if LSI_A itself results in a good product. In this case, in particular, a combination with the configuration (2) makes collective transmission of the test results possible without preparing a special Through Silicon Via.

(5) Fifth, such a configuration is adopted as to provide a 2:1 selector circuit to sequentially shift Through Silicon Vias following a defective Through Silicon Via, thereby performing remedy. This configuration solves the problem that preparing one spare Through Silicon Via for one Through Silicon Via, as in the case of the Patent Document 1, increases the number of spare Through Silicon Vias, which results in a large demerit regarding an area. Further, the configuration solves a problem of degradation in circuit symmetry caused by adopting such a configuration as to provide one spare Through Silicon Via for a plurality of Through Silicon Vias and replace a defective Through Silicon Via with the spare Through Silicon Via. This configuration improves the circuit symmetry, so that such an improvement as reduction of signal transmission delay or the like is achieved.

(6) Sixth, the present invention is characterized by a configuration to have a Through Silicon Via for test setting. This configuration solves the problem that test conditions cannot be set from a tester, unlike a conventional test method, since a Through Silicon Via of each LSI is not exposed after stacking and a probe or the like cannot be used. This configuration makes it possible to put each LSI in a test operation even if it cannot be touched directly by a probe. Further, a portion of the Through Silicon Via for the test adopts a flip-flop chain configuration. This makes various test operations possible with a small number of Through Silicon Vias.

(7) Seventh, the present invention is characterized by a configuration to contain a control unit that controls test of a Through Silicon Via in a lowermost LSI connected to a package substrate. This configuration solves the problem of how to control a test of a semiconductor device using a Through Silicon Via that has not been tested and therefore whose quality has not been guaranteed. Adopting this configuration makes it possible to perform a test of a Through Silicon Via using an LSI connected by a proven joining method, so that such a situation of not performing a test operation can be avoided.

[Second Embodiment]

Figure 10:
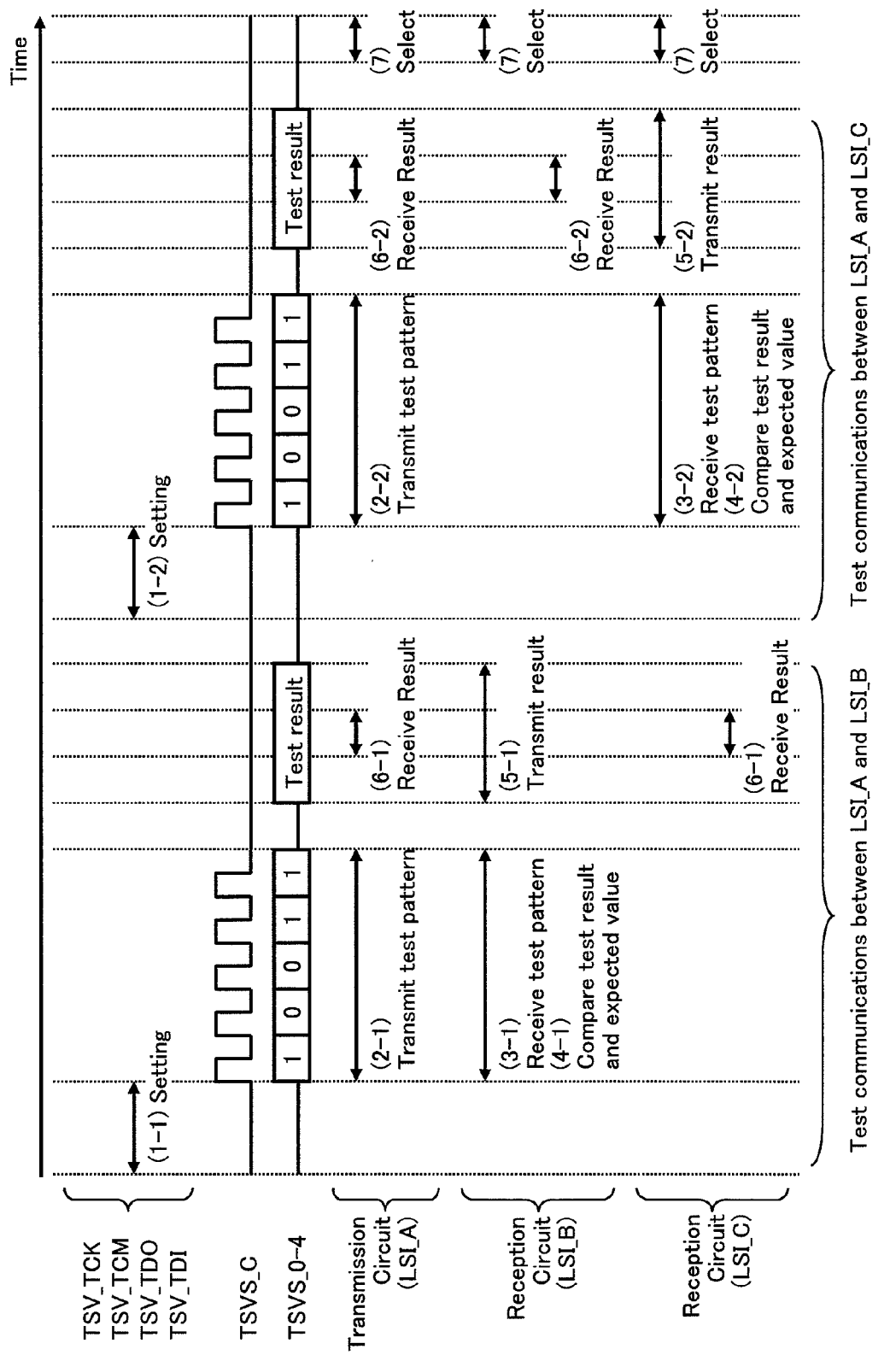
FIG. 10 illustrates a procedure of a Through Silicon Via test.

Next, a method of a Through Silicon Via test that is different from that illustrated in FIG. 4, will be referred. FIG. 10 illustrates, as another procedure of the Through Silicon Via test that is different from that illustrated in FIG. 4, a procedure of sequentially performing a test of communication from LSI_A to LSI_B and a test of communication from LSI_A to LSI_C. In FIG. 10, (1-1), (2-1), (3-1), (4-1), (5-1), (6-1) are steps for performing the test of communication from LSI A to LSI B, and (1-2), (2-2), (3-2), (4-2), (5-2), (6-2) are steps for performing the test of communication from LSI_A to LSI_C. At (7), Through Silicon Vias are selected based upon both of the test results such that a defective Through Silicon Via is not used, and the selection result is stored in TMEM in CRTSV. At (1-1), PUTM in LSI_A sets CRTSV of LSI_A to be tested as a transmitting circuit, sets CRTSV of LSI_B to be tested as a receiving circuit, and sets CRTSV of LSI_C to be excluded from the test target, resulting in non-operation, through the Through Silicon Vias TSV_TCK, TSV_TCM, TSV_TDO, and TSV_TDI. Thereafter, LSI_B is tested in the same manner as in the case of the first embodiment, and at (5-1) the test result is transmitted to a Through Silicon Via. The result is received simultaneously by LSI_A and LSI_C at (6-1). Next, at (1-2), PUTM in LSI_A sets CRTSV of LSI_A to be tested as a transmitting circuit, sets CRTSV of LSI_B to be excluded from the test target, and sets CRTSV of LSI_C to be tested as a receiving circuit, through the Through Silicon Vias TSV_TCK, TSV_TCM, TSV_TDO, and TSV_TDI, and the test is performed in the same manner ((2-2), (3-2), (4-2), (5-2), (6-2)). Finally, at (7), LSI_A, LSI_B, and LSI_C select Through Silicon Vias based upon the test results.

In this system, as compared with the aspect in FIG. 4, the test control is complicated, and the test time is also extended, but since the test result is always outputted only from one LSI, there is the advantage that such a special circuit as illustrated in FIG. 6 is not required as a test result transmitting circuit. Therefore, it becomes possible to use an ordinary transmitting circuit for signal output. Note that the above-described setting can be achieved by using a flip-flop chain described in the first embodiment.

[Third Embodiment]

In the first and second embodiments, the methods of detecting a short-circuit fault or a delay fault of Through Silicon Vias in a series of routes from a transmitting circuit to a receiving circuit have been described. There is a method can be a method that tests only circuits at both ends of the Through Silicon Via as another method. If the configuration in FIG. 3 is taken as an example as in the cases of the first and second embodiments, the procedure is such that only Through Silicon Vias between LSI_A and LSI_C are tested. That is, it corresponds to performing only the test ((1-2), (2-2), (3-2), (4-2), (5-2), (6-2), (7)) on LSI_C in the test procedure in FIG. 10.

This method has the advantage that the test procedure becomes simpler than that of the second embodiment. On the other hand, since only Through Silicon Via portions are tested regarding an interlayer LSI, for example, a portion from the Through Silicon Vias of LSI_B to the circuit portion is excluded from the test target.

[Fourth Embodiment]

Regarding the first to third embodiments, their systems are such that CRTSVs on the receiving side transmit their Through Silicon Via test results in parallel using many Through Silicon Vias, and CRTSVs on the transmitting and receiving sides select Through Silicon Vias in parallel. Another aspect can be a system that collects the Through Silicon Via test results retained by CRTSVs on the receiving side through TSVS_TDO.

Figure 11:
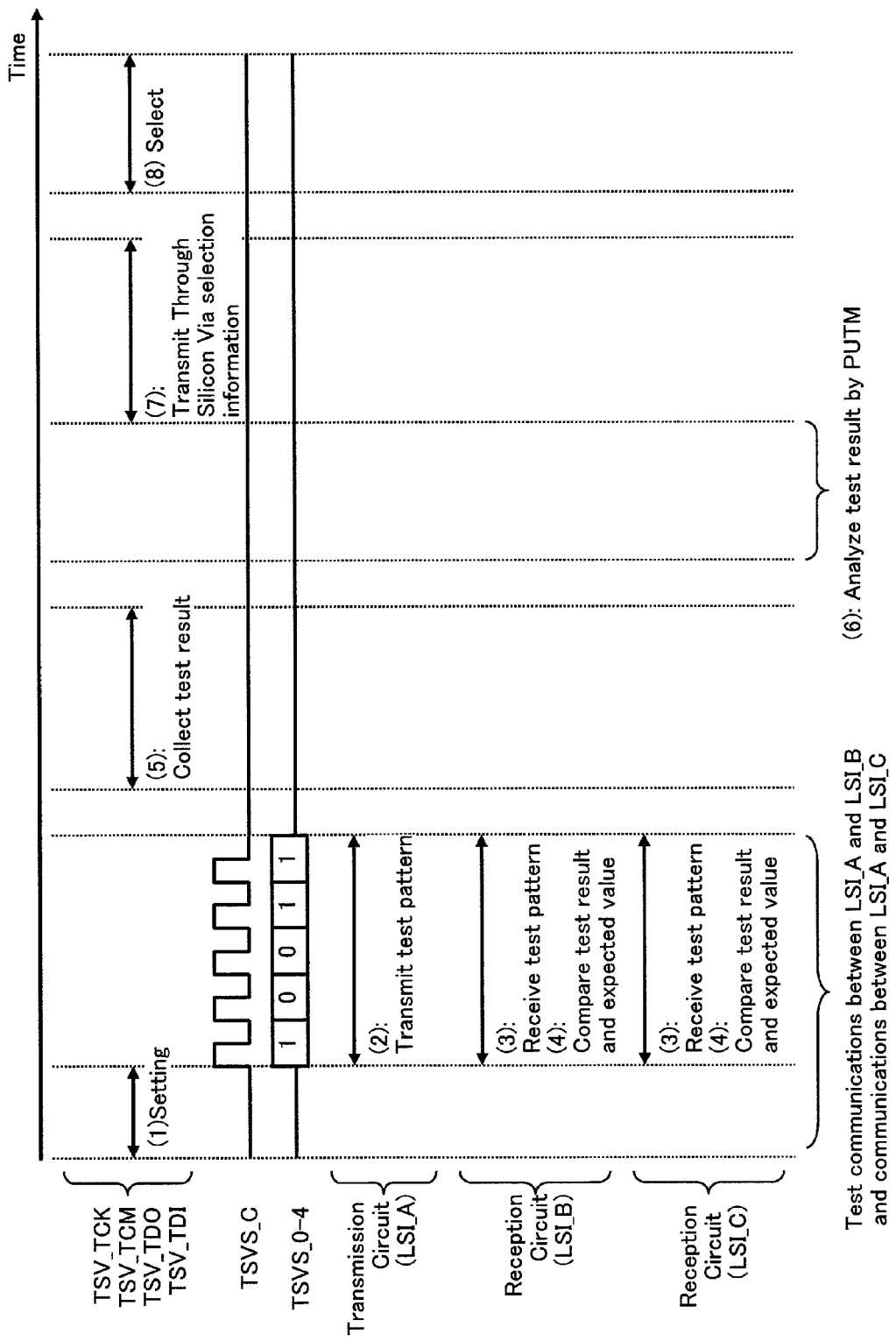
FIG. 11 illustrates a procedure of a Through Silicon Via test.

FIG. 11 illustrates a test procedure using this system. This procedure will be also described based upon the aspect in FIG. 3. The test procedure is composed of (1) performing Through Silicon Via test setting for each LSI, (2) transmitting a test pattern to a Through Silicon Via by a transmitting circuit of LSI_A, (3) receiving the test pattern from the Through Silicon Via by the receiving circuits of LSI_B and LSI_C, (4) comparing the test pattern received with an expected value by TCRCs in the receiving circuits of LSI_B and LSI_C, (5) collecting the test results using TSVS_TCK, TSVS_TCM, TSVS_TDO, TSVS_TDI, and TSVS_TRS, (6) analyzing the test results by LSI_A, (7) transmitting information of Through Silicon Via to be selected using TSVS_TCK, TSVS_TCM, TSVS_TDO, TSVS_TDI, and TSVS_TRS, (8) reflecting the Through Silicon Via selection information in TMEM by LSI_A, LSI_B, and LSI_C. In this procedure, (1) to (4) are the same as in the first to third embodiments.

At (5), LSI_A collects the test results from LSI_B and LSI_C, using TSVS_TCK, TSVS_TCM, TSVS_TDO, TSVS_TDI, and TSVS_TRS. TCCTRLM in LSI_A uses TSVS_TCK and TSVS_TCM to cause TCCTRL in LSI_B and LSI_C to transit to a result acquiring state. At this time, the test result information retained by TCRC and FUNC in LSI_B and LSI_C are transmitted to flip-flop chains of TTDOC in TCCTRL through TCOT and TTDIB in TCCTRL. Next, LSI_A uses TSVS_TCK and TSVS_TCM to cause TCCTRL of LSI_B and LSI_C to transit to a result transfer state (a shift operation state). In this state, the information in the flip-flop chains in TTDOC is shift-transferred from TSVS_TDO_T toward TSVS_TDO_B in synchronization with the rising of a clock of TSVS_TCK. By repeating this shift operation as many times as needed, LSI_A can acquire the test result information from LSI_B and LSI_C.

At (6), PUTM in LSI_A collects the Through Silicon Via test result information of LSI_B and LSI_C acquired at (5) and the test result information in LSI_A, determines whether there is a defect or not for each Through Silicon Via, and determines Through Silicon Vias to be used. The test result information in LSI_A is acquired by using an on-chip wiring.

At (7), LSI_A uses TSVS_TCK, TSVS_TCM, TSVS_TDO, TSVS_TDI, and TSVS_TRS to transmit selection information of the Through Silicon Vias to be used to LSI_B and LSI_C. TCCTRLM in LSI_A uses TSVS_TCK and TSVS_TCM to cause TCCTRL in LSI_B and LSI_C to transit to a result acquiring state. A state of transferring input (a shift operation state) is obtained. In this state, TCCTRLM in LSI_A transmits the Through Silicon Via selection information to flip-flop chains in TCCTRL of LSI_3 and LSI_C. After this input by the shift operation is completed, TCCTRL of LSI_B and LSI_C are put into a setting determination state. The values of the flip-flop chains in TCCTRL of LSI_B and LSI_C at the time point of being put into this state are transmitted to TCRC of LSI_B and LSI_C. PUTM also transmits the Through Silicon Via selection information to TCRC of LSI_A, using an on-ship wiring.

At (8), TCRC of LSI_A, LSI_B, and LSI_C store the Through Silicon Via selection information transmitted at (7) in TMEM, and based upon this, Through Silicon Vias to be used are determined.

This aspect has effects of circuit-scale reduction and Through Silicon Via load reduction, since the TDRV circuit does not need to have a transmitting circuit (TDRVRBUF) or a receiving circuit (TDRVTBUF) dedicated for test. Further, since PUTM collects the test results all at once and determines Through Silicon Vias to be used, the degree of freedom of selection of Through Silicon Vias is easier to increase than that of the first to third embodiments. For example, it is also easy to adapt to such a system that remedies more than one defective Through Silicon Via by providing more than one spare Through Silicon Via in one Through Silicon Via group.

Further, in the fourth embodiment, though the test results are read by using the Through Silicon Vias for test, it is also possible to retain the test patterns transmitted from a transmitting circuit by a receiving circuit and read the test patterns using the Through Silicon Vias for test. In this case, since the test pattern does not need to be retained by a receiving circuit, a circuit area can be reduced.

However, by retaining the test pattern also in a receiving circuit like the present embodiment, speed-up of the testing time can be achieved, since only one bit of the test result is read by using the Through Silicon Via for test.

[Fifth Embodiment]

In any of the above-described first to fourth embodiments, the Through Silicon Via test of the present invention is required to be performed after LSIs are stacked (assembled) so that Through Silicon Vias to be used are determined based upon the result. On the other hand, regarding the conventional LSI test methods, there is a semiconductor memory as one using a method that separates a defective portion based upon a test result, where a redundant circuit is provided. In this case, a defective portion is specified before assembly, and the defective portion is remedied by being separated by a fuse circuit or the like. This method is suitable for a conventional semiconductor memory that can be tested and remedied before assembly, but it is difficult to apply this method to a Through Silicon Via, since a defective portion can be specified only after assembly.

In the present invention, the test and remedy after assembly is made possible by providing a means for storing a sequence for test or a means for storing the test result outside stacked LSIs. An embodiment will be described below.

Figure 12:
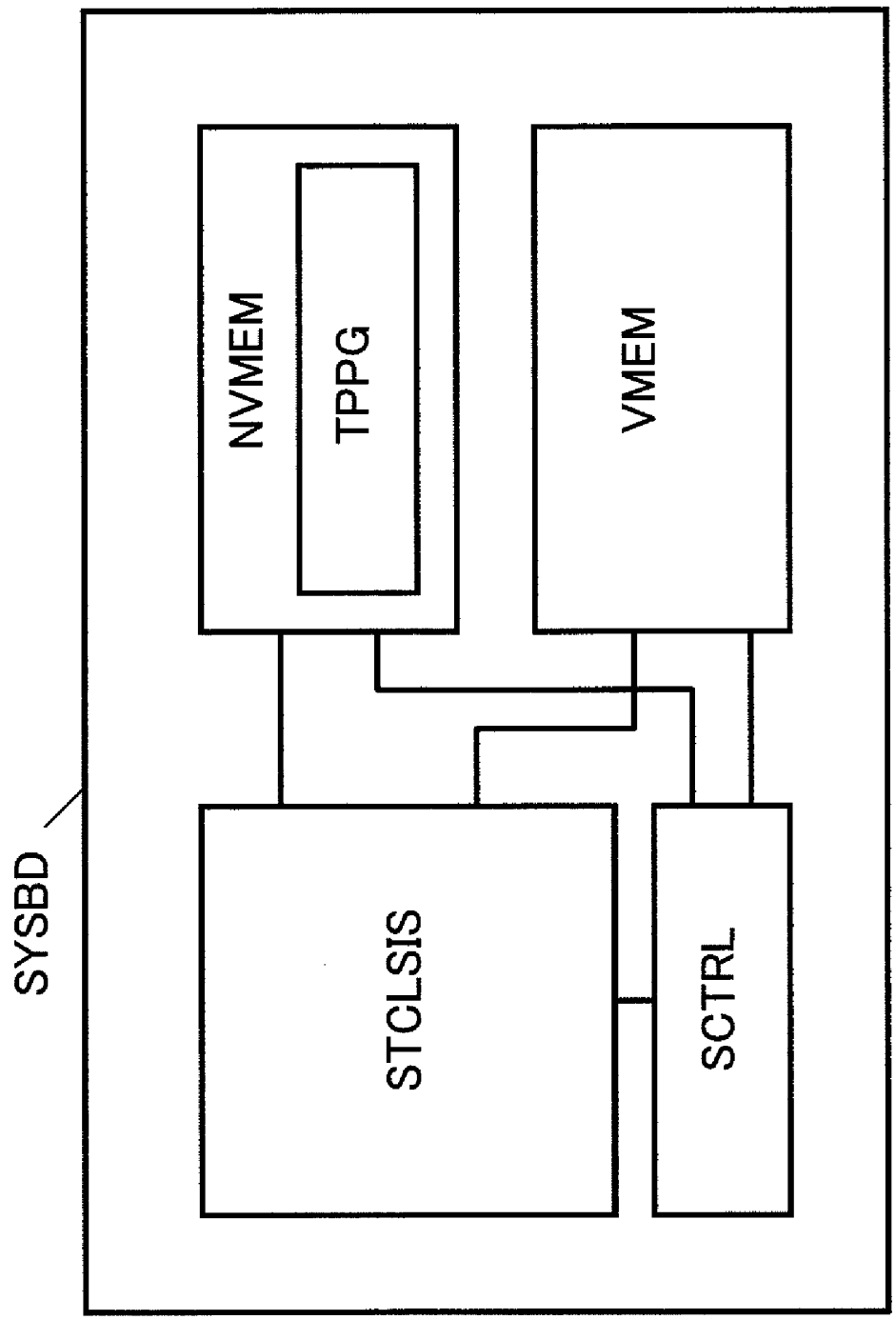
FIG. 12 illustrates a stacked-LSI system configuration for performing a Through Silicon Via test.

FIG. 12 illustrates a first aspect. SYSBD is a board mounted with stacked LSIs, STCLSIS is stacked LSIs having Through Silicon Vias, NVMEM is a nonvolatile memory, such as a flash memory or a ROM, VMEM is a volatile memory, such as a DRAM, and SCTRL is a system controller that controls reset or the like at a power-on time. In this aspect, when STCLSIS is powered on, a program TPPG in which a procedure of the Through Silicon Via test stored in NVMEM is written is executed by STCLSIS, and Through Silicon Via selection information based upon the result is stored in TMEM in STCLSIS. The agent of taking control of the Through Silicon Via test is PUTM in the lowermost LSI of STCLSIS in the first to fourth embodiments, but it may be an external part. For example, the agent of performing execution of TPPG may be SCTRL instead of STCLSIS. Or, it may be both STCLSIS and SCTRL.

Figure 13:
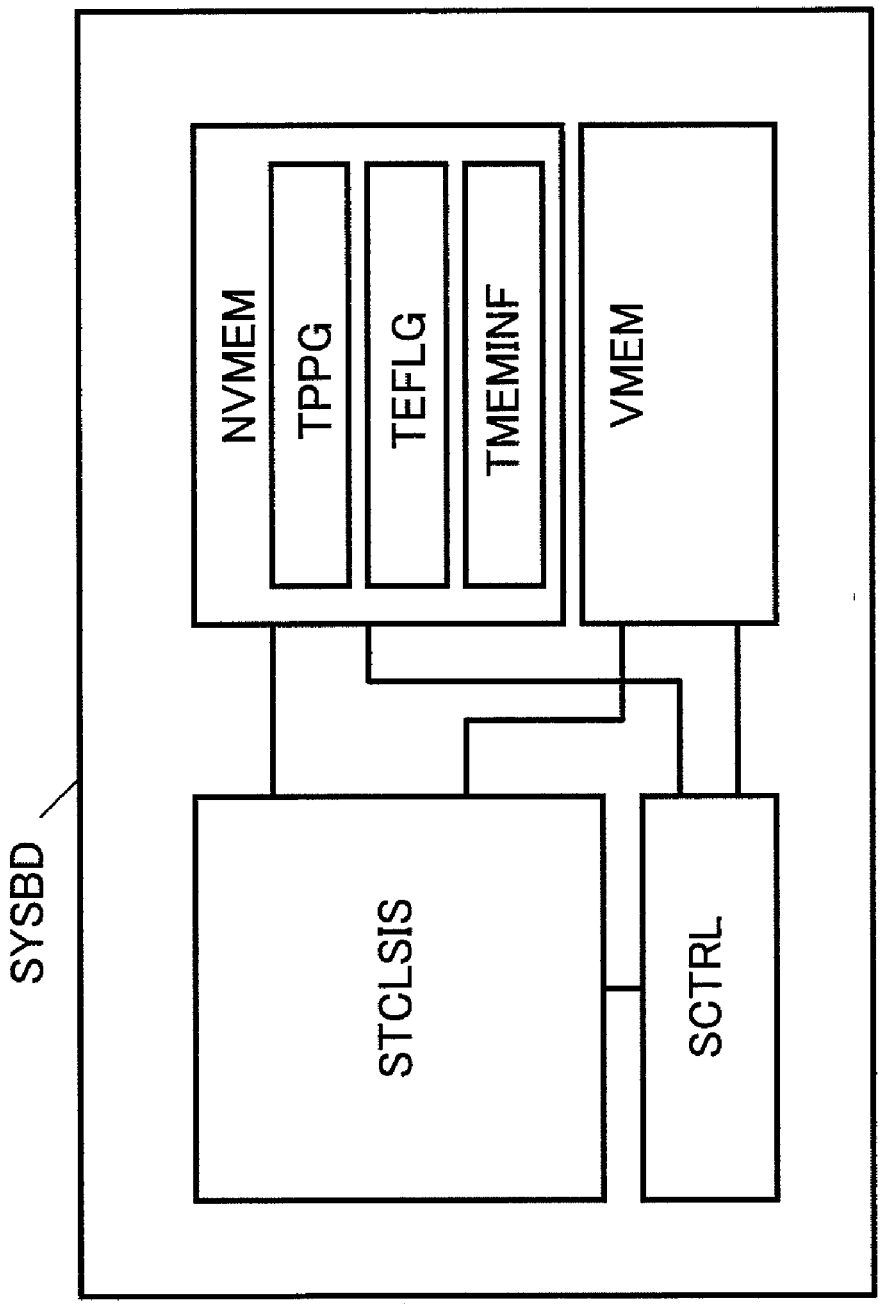
FIG. 13 illustrates a stacked-LSI system configuration for performing a Through Silicon Via test.

FIG. 13 illustrates a second aspect. The first aspect adopts the system of performing the Through Silicon Via test every time STCLSIS is powered on, but this system is a system of performing the test only once. First, according to the program TPPG, the test shown in the fifth embodiment is performed and the test result is read out. Thereafter, information of Through Silicon Via to be selected TMEMINF based upon the Through Silicon Via test result and information TEFLG representing that the Through Silicon Via test has been done are written in NVMEM upon the Through Silicon Via test. From the second time, TEFLG is checked, and if the test has been done, STCLSIS does not perform the Through Silicon Via test and performs setting of Through Silicon Vias to be used on TMEM with use of TMEMINF. Further, the agent of performing execution of TPPG may be SCTRL instead of STCLSIS. Alternatively, it may be both STCLSIS and SCTRL.

Figure 14:
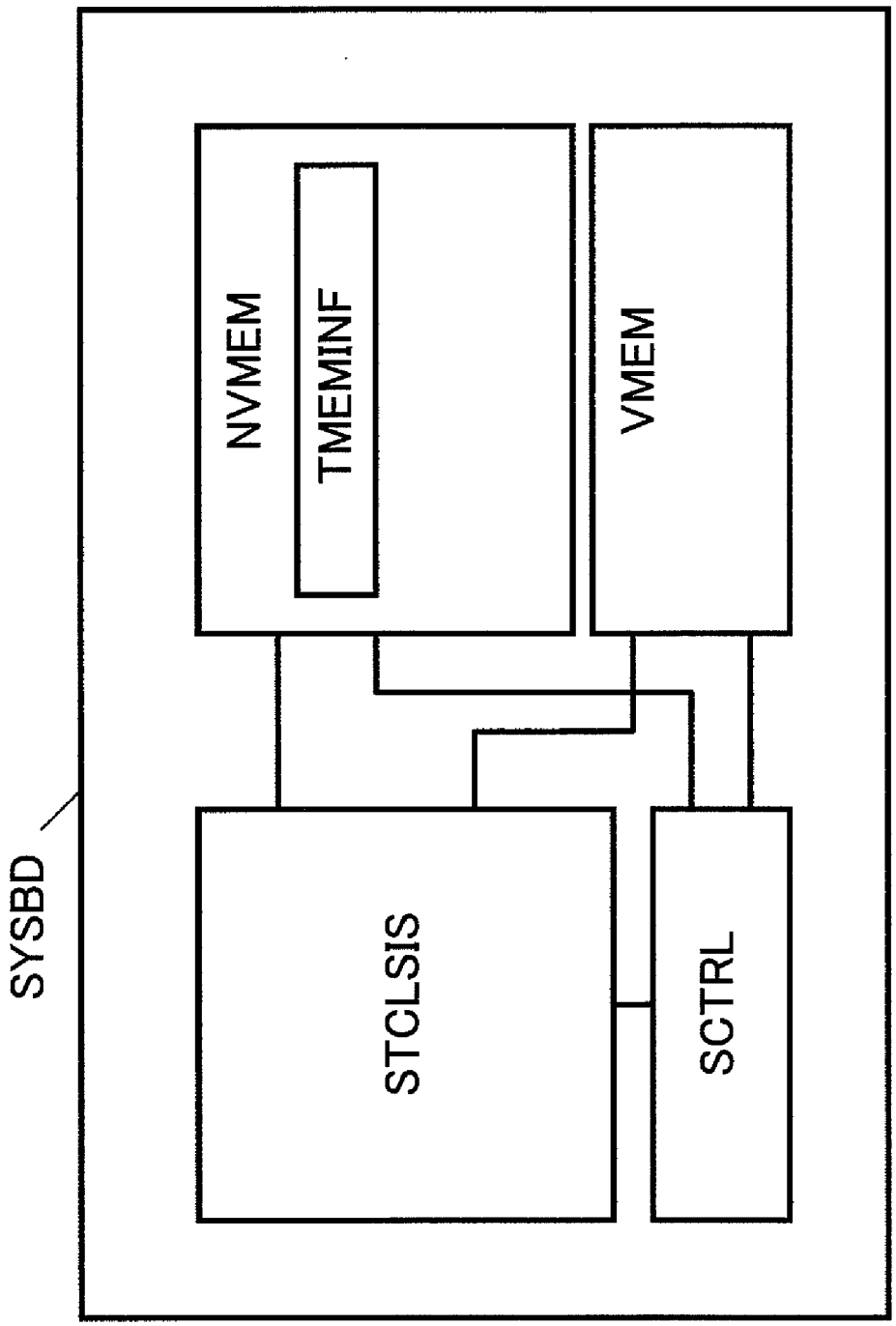
FIG. 14 illustrates a stacked-LSI system configuration for performing a Through Silicon Via test.

FIG. 14 illustrates a third aspect. Unlike the first and second aspects, the program TPPG for performing the Through Silicon Via test is not loaded in the third aspect. TMEMINF based upon the result of the test performed in advance is stored in NVMEM. Therefore, without performing the Through Silicon Via test after mounting STCLSIS on a mass-produced board, STCLSIS performs setting of Through Silicon Vias to be used on TMEM based upon TMEMINF. A method that a non-volatile memory is mounted in LSIs to be stacked is considered, but the cost increases in many cases. Since a nonvolatile memory is mounted on a board in most systems, the aspect described in the present invention that the procedure for test and the Through Silicon Via selection information based upon the test result are stored in a nonvolatile memory external to the stacked LSIs makes possible the Through Silicon Via test and remedy with increase in cost suppressed.

As described above, first, the fifth embodiment is characterized by preparing a test program in a nonvolatile memory provided outside a semiconductor device, executing the test program at the power-on time, and starting normal operation after storing the result and remedy information in a memory unit composed of a volatile memory in each LSI. Second, the fifth embodiment is characterized by storing remedy information in a nonvolatile memory provided outside, based upon a result of a test performed before shipment, and transferring the remedy information to each LSI at the power-on time. These procedures solve the problem that a conventional method of storing remedy information, such as a fuse, cannot be used, since the Through Silicon Via test cannot be performed until assembly is done. Though taking time at the power-on time of the power supply, the former procedure can also remedy a defect due to aging. On the other hand, the latter procedure can save upon the power-on, so that rapid start-up becomes possible. Further, both the cases can be achieved without including a nonvolatile memory in LSIs.

INDUSTRIAL APPLICABILITY

The present invention is applicable to a semiconductor device having a plurality of LSIs being stacked.

The invention claimed is:

1. A semiconductor device in which a first LSI and a second LSI are stacked, wherein
the first LSI and the second LSI are connected through a first Through Silicon Via;
the first LSI has a first transmitting circuit connected to the first Through Silicon Via, and a first test circuit that transmits a test pattern which is a combination of a logic value "0" and a logic value "1" to the first Through Silicon Via through the first transmitting circuit; and
the second LSI has a first receiving circuit connected to the first Through Silicon Via, and a second test circuit that retains a test pattern identical with the test pattern transmitted by the first LSI, and compares the test pattern with a test pattern received by the first receiving circuit to check whether or not the first Through Silicon Via is correctly connected.

2. The semiconductor device according to claim 1, wherein
the semiconductor device further comprises a second Through Silicon Via to connect the first LSI and the second LSI,
the second LSI further has a second transmitting circuit connected to the second Through Silicon Via;
the first LSI further has a third transmitting circuit and a second receiving circuit that are connected to the second Through Silicon Via;
the first test circuit transmits the test pattern to the second Through Silicon Via through the third transmitting circuit;
the second test circuit outputs a test result of the first Through Silicon Via to the second Through Silicon Via through the second transmitting circuit; and
the second receiving circuit receives the test result of the first Through Silicon Via outputted to the second Through Silicon Via.

3. The semiconductor device according to claim 2, wherein:
the semiconductor device further comprises a third LSI stacked on the first and second LSIs and connected to the first and second Through Silicon Vias;
the third LSI has a third receiving circuit connected to the second Through Silicon Via; and
the third receiving circuit receives the test result of the first Through Silicon Via outputted to the second Through Silicon Via in the same period with the second receiving circuit.

4. The semiconductor device according to claim 3, wherein:
the third LSI has a fourth receiving circuit connected to the first Through Silicon Via, a fourth transmitting circuit connected to the second Through Silicon Via, and a third test circuit that retains a test pattern identical with the test pattern retained by the first LSI, compares the same with the test pattern received by the fourth receiving circuit to check whether or not the first Through Silicon Via is correctly connected, and outputs a test result of the first Through Silicon Via to the second Through Silicon Via through the fourth transmitting circuit;
the fourth transmitting circuit receives the test pattern in synchronization with the first receiving circuit; and
the third test circuit controls the fourth transmitting circuit so as to output the test result of the first Through Silicon Via to the second Through Silicon Via in synchronization with the second transmitting circuit.

5. The semiconductor device according to claim 2, wherein
the second test circuit causes the second transmitting circuit to output a first potential when the test result of the first Through Silicon Via coincides with the test pattern, and causes the second transmitting circuit to output a second potential when the test result of the first Through Silicon Via does not coincide with the test pattern; and
the second transmitting circuit has a first switch element that outputs the first potential, and a second switch element that outputs the second potential and is larger in drive force than the first switch element.

6. The semiconductor device according to claim 2, wherein
the second test circuit controls the second transmitting circuit so as to precharge the second Through Silicon Via to a first potential and then put the same into a floating state, before outputting the test result of the first Through Silicon Via to the second Through Silicon Via, and controls the second transmitting circuit so as to output a second potential when the test result does not coincide with the test pattern, after putting the second Through Silicon Via into a floating state.

7. The semiconductor device according to claim 2, wherein
the semiconductor device further comprises a third Through Silicon Via connecting the first LSI and the second LSI;
the first LSI has a first function block;
the first test circuit transmits test pattern to the second Through Silicon Via as well as transmitting the test pattern to the first Through Silicon Via;
the second test circuit performs comparison of the test pattern transmitted to the second Through Silicon Via, as well as performing comparison of the test pattern transmitted to the first Through Silicon Via, thereby testing the first Through Silicon Via and the second Through Silicon Via;
the first function block has a first output that outputs a signal to the first Through Silicon Via and a second output that outputs a signal to the second Through Silicon Via, when the first Through Silicon Via is correctly connected; and
when the test result of the first Through Silicon Via is not coincided and a test result of the second Through Silicon Via is coincided in the second test circuit, the first output outputs a signal to the second Through Silicon Via, and the second output outputs a signal to the third Through Silicon Via.

8. The semiconductor device according to claim 7, wherein
the first LSI further has a 1:2 first selection circuit that selects outputting the signal of the first output to the first Through Silicon Via or outputting the same to the second Through Silicon Via, and a 1:2 second selection circuit that selects outputting the signal of the second output to the second Through Silicon Via or outputting the same to the third Through Silicon Via.

9. The semiconductor device according to claim 8, wherein
each of the first and second LSIs further has a memory unit that stores selection information of the first selection circuit and the second selection circuit.

10. The semiconductor device according to claim 1, wherein:
the first LSI and the second LSI are formed in one package; and
the semiconductor device has a substrate that is connected to the first LSI and receives a signal from outside the semiconductor device.

11. The semiconductor device according to claim 10, wherein:
the semiconductor device further comprises a fourth Through Silicon Via connecting the first LSI and the second LSI;

the first test circuit outputs test setting information about the second LSI to the fourth Through Silicon Via; and the second test circuit performs an operation of comparison between the test pattern supplied through the first Through Silicon Via and the test pattern retained, after receiving the test setting information.

12. The semiconductor device according to claim 11, wherein a cross-sectional area of the fourth Through Silicon Via parallel to a surface of the first LSI is larger than a cross-sectional area of the first Through Silicon Via parallel to the surface of the first LSI.

13. The semiconductor device according to claim 11, wherein:

the semiconductor device further has a third LSI stacked on the second LSI, a fifth Through Silicon Via connecting the second LSI and the third LSI, and a sixth Through Silicon Via connecting the first, second, and third LSIs;

the second LSI further has a first flip-flop circuit disposed between the fourth Through Silicon Via and the fifth Through Silicon Via;

the third LSI further has a second flip-flop circuit connected to the fifth Through Silicon Via;

the first flip-flop circuit takes data supplied through the fourth Through Silicon Via based upon a clock signal supplied through the sixth Through Silicon Via, and outputs the data to the fifth Through Silicon Via; and the second flip-flop circuit takes the data outputted to the fifth Through Silicon Via by the first flip-flop circuit, based upon the clock signal supplied through the sixth Through Silicon Via.

14. The semiconductor device according to claim 11, wherein the test pattern retained in the second LSI is supplied from the first LSI through the fourth Through Silicon Via before a test operation.

15. The semiconductor device according to claim 11, wherein the first LSI reads a program for test operation from a nonvolatile memory disposed outside, and designates the second LSI to perform the test operation through the fourth Through Silicon Via.

16. The semiconductor device according to claim 11, wherein:

the semiconductor device further comprises a third Through Silicon Via connecting the first LSI and the second LSI;

the first LSI has a first function block;

the first test circuit transmits a test pattern to the second Through Silicon Via as well as transmitting the test pattern to the first Through Silicon Via;

the second test circuit performs comparison of the test pattern transmitted to the second Through Silicon Via, as well as performing comparison of the test pattern transmitted to the first Through Silicon Via, thereby testing the first Through Silicon Via and the second Through Silicon Via;

the first function block has a first output that outputs a signal to the first Through Silicon Via and a second output that outputs a signal to the second Through Silicon Via, when the first Through Silicon Via is correctly connected;

when the test result of the first Through Silicon Via is coincided and a test result of the second Through Silicon Via is coincided in the second test circuit, the first output outputs a signal to the second Through Silicon Via, and the second output outputs a signal to the third Through Silicon Via; and the semiconductor device retains information about which Through Silicon Via the first and second outputs are outputted from in an external nonvolatile memory, reads the same from the nonvolatile memory upon power-on of a power supply, and transmits the same to the second LSI through the fourth Through Silicon Via.

17. The semiconductor device according to claim 1, wherein the semiconductor device further comprises a second Through Silicon Via to connect the first LSI and the second LSI, the first LSI further has a second receiving circuit connected to the second Through Silicon Via;

the second LSI further has a second transmitting circuit connected to the second Through Silicon Via;

the second test circuit outputs a test result of the first Through Silicon Via to the second Through Silicon Via through the second transmitting circuit; and the first receiving circuit receives the test result of the first Through Silicon Via outputted to the second Through Silicon Via.

18. The semiconductor device according to claim 17, wherein:

the first LSI further has a third transmitting circuit connected to the second Through Silicon Via;

the semiconductor device further comprises a third LSI stacked on the first and second LSIs and connected to the first and second Through Silicon Vias;

the third LSI has a third receiving circuit connected to the second Through Silicon Via; and the third receiving circuit receives the test result of the first Through Silicon Via outputted to the second Through Silicon Via in the same period with the first receiving circuit.

* * * * *